United States Patent
Matsuyama et al.

(10) Patent No.: US 11,972,718 B2
(45) Date of Patent: Apr. 30, 2024

(54) DISPLAY DEVICE, ELECTRONIC APPARATUS, AND MOVING BODY

(71) Applicant: CANON KABUSHIKI KAISHA, Tokyo (JP)

(72) Inventors: Kazunori Matsuyama, Kanagawa (JP); Noriyuki Shikina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/184,987

(22) Filed: Mar. 16, 2023

(65) Prior Publication Data
US 2023/0298506 A1 Sep. 21, 2023

Related U.S. Application Data

(63) Continuation of application No. PCT/JP2021/036922, filed on Oct. 6, 2021.

(30) Foreign Application Priority Data

Oct. 12, 2020 (JP) .................................. 2020-172134

(51) Int. Cl.
G09G 3/20 (2006.01)
G09G 3/3225 (2016.01)

(52) U.S. Cl.
CPC ......... *G09G 3/2074* (2013.01); *G09G 3/2022* (2013.01); *G09G 3/2081* (2013.01); *G09G 3/3225* (2013.01)

(58) Field of Classification Search
CPC .. G09G 3/2074; G09G 3/2022; G09G 3/2081; G09G 3/3225; G09G 2300/0861;
(Continued)

(56) References Cited

U.S. PATENT DOCUMENTS 5,748,164 A * 5/1998 Handschy ............ G09G 3/3406
345/87
6,243,055 B1 * 6/2001 Fergason ............... G09G 3/007
349/196
(Continued)

FOREIGN PATENT DOCUMENTS

CN 1216135 A * 5/1999 ........... G09G 3/2011
CN 1866340 A * 11/2006 ........... G09G 3/2022
(Continued)

OTHER PUBLICATIONS

Dec. 21, 2021 International Search Report in International Patent Appln. No. PCT/JP2021/036922.
(Continued)

*Primary Examiner* — Ricardo Osorio
(74) *Attorney, Agent, or Firm* — Venable LLP

(57) ABSTRACT

A display device displays an image in which each frame is formed by at least two subframes. The display device includes a drive unit configured to drive a plurality of pixels in a pixel array so as to drive pixels in at least two rows based on pixel data of each row of each supplied subframe data. The drive unit drives the plurality of pixels so as to cause pixels in a row not matching a row in the supplied current subframe data to emit light with a first condition, and cause pixels in a row matching the row in the current subframe data to emit light with a second condition. The second condition is a condition in which a light emission amount is larger than in the first condition when causing the pixels to emit light in accordance with identical pixel values.

14 Claims, 15 Drawing Sheets

(58) Field of Classification Search
CPC ......... G09G 2310/0205; G09G 3/3233; G09G 3/3266; G09G 2380/10; H10K 59/65; H10K 59/10; H04N 5/66; H05B 33/12
See application file for complete search history.

(56) References Cited

U.S. PATENT DOCUMENTS

| | | | |
|---|---|---|---|
| 6,538,664 | B2 | 3/2003 | Fisekovic |
| 6,952,194 | B1 * | 10/2005 | Yamazaki ............ G09G 3/2011 345/94 |
| 7,453,478 | B2 * | 11/2008 | Martin ...................... G09G 3/20 348/758 |
| 7,605,899 | B2 | 10/2009 | Shikina |
| 7,812,812 | B2 | 10/2010 | Yoshinaga |
| 8,203,511 | B2 | 6/2012 | Shikina |
| 9,354,494 | B2 * | 5/2016 | Mashitani ............ H04N 9/3188 |
| 10,049,628 | B2 | 8/2018 | Kim |
| 2001/0038374 | A1 | 11/2001 | Fisekovic |
| 2010/0295844 | A1 | 11/2010 | Hayashi |
| 2013/0120477 | A1 * | 5/2013 | Matsumoto .............. G09G 3/32 345/82 |
| 2016/0155405 | A1 | 6/2016 | Kim |
| 2017/0004783 | A1 | 1/2017 | Ishihara |
| 2020/0058690 | A1 * | 2/2020 | Kim .................. H01L 27/14634 |

FOREIGN PATENT DOCUMENTS

| | | | |
|---|---|---|---|
| JP | 2003-532145 A | 10/2003 | |
| JP | 2010-271365 A | 12/2010 | |
| JP | 2016-110115 A | 6/2016 | |
| KR | 2002-0025897 A | 4/2002 | |
| KR | 20020080248 A * | 10/2002 | |
| KR | 10-2016-0066131 A1 | 6/2016 | |
| WO | 01/82280 A1 | 11/2001 | |
| WO | WO-0182280 A1 * | 11/2001 | ........... G09G 3/2022 |
| WO | 2015/087598 A1 | 6/2015 | |

OTHER PUBLICATIONS

Feb. 29, 2024 Korean Official Action in Korean Patent Appln. No. 10-2023-7013403.

* cited by examiner

| COMPARATIVE EXAMPLE | | | | | | | | | EMBODIMENT | | | | | | |
|---|---|---|---|---|---|---|---|---|---|---|---|---|---|---|---|
| 40 | 50 | 60 | 65 | 65 | 65 | 65 | 65 | | 30 | 40 | 50 | 56 | 59 | 61 | 64 | 66 |
| 65 | 65 | 65 | 60 | 50 | 40 | 35 | 40 | | 69 | 71 | 74 | 70 | 60 | 50 | 44 | 45 |
| 45 | 50 | 55 | 60 | 55 | 40 | 30 | 30 | | 46 | 48 | 49 | 50 | 44 | 30 | 23 | 28 |
| 30 | 30 | 40 | 75 | 50 | 65 | 30 | 45 | | 33 | 38 | 50 | 81 | 63 | 69 | 38 | 44 |
| 20 | 0 | 25 | 25 | 25 | 25 | 25 | 25 | | 20 | 0 | 19 | 31 | 19 | 31 | 19 | 31 |
| 20 | 0 | 25 | 50 | 75 | 45 | 75 | 10 | | 20 | 0 | 31 | 38 | 69 | 34 | 69 | 7.5 |
| 20 | 0 | 50 | 50 | 100 | 65 | 100 | 60 | | 20 | 0 | 38 | 63 | 100 | 71 | 100 | 50 |
| 60 | 50 | 100 | 50 | 100 | 70 | 100 | 100 | | 20 | 0 | 100 | 0 | 100 | 40 | 100 | 100 |

F I G. 7E

| COMPARATIVE EXAMPLE | | | | | | | | | EMBODIMENT | | | | | | |
|---|---|---|---|---|---|---|---|---|---|---|---|---|---|---|---|
| 40 | 40 | 40 | 35 | 25 | 15 | 5 | 5 | | 30 | 30 | 30 | 26 | 19 | 11 | 3.8 | 3.7 |
| 15 | 25 | 35 | 40 | 40 | 40 | 35 | 20 | | 11 | 19 | 26 | 30 | 30 | 30 | 26 | 15 |
| 5 | 10 | 25 | 40 | 45 | 40 | 30 | 10 | | 3.7 | 7.6 | 19 | 30 | 34 | 30 | 23 | 7.5 |
| 10 | 30 | 40 | 25 | 50 | 15 | 30 | 5 | | 7.5 | 23 | 30 | 19 | 38 | 11 | 23 | 3.8 |
| 0 | 0 | 25 | 25 | 25 | 25 | 25 | 25 | | 0 | 0 | 19 | 19 | 19 | 19 | 19 | 19 |
| 0 | 0 | 25 | 50 | 25 | 45 | 25 | 10 | | 0 | 0 | 19 | 38 | 19 | 34 | 19 | 7.5 |
| 0 | 0 | 50 | 50 | 0 | 25 | 0 | 40 | | 0 | 0 | 38 | 38 | 0.1 | 19 | 0.1 | 30 |
| 40 | 50 | 0 | 50 | 0 | 30 | 0 | 0 | | 0 | 0 | 0.1 | 0 | 0.1 | 0 | 0.1 | 0.1 |

DISPLAY DEVICE, ELECTRONIC APPARATUS, AND MOVING BODY

CROSS-REFERENCE TO RELATED APPLICATIONS

This application is a Continuation of International Patent Application No. PCT/JP2021/036922, filed Oct. 6, 2021, which claims the benefit of Japanese Patent Application No. 2020-172134, filed Oct. 12, 2020, both of which are hereby incorporated by reference herein in their entirety.

BACKGROUND OF THE INVENTION

Field of the Invention

The present invention relates to a display device, an electronic apparatus, and a moving body.

Background Art

There is a display device that drives pixels by a multi-line drive method for driving pixels in two or more rows using the pixel data of each row in order to reduce the input data amount and shorten the time required for frame display. In the multi-line drive method, for each subframe, two or more rows to be supplied with the pixel data of each row are changed to distribute an original image and an interpolation image, thereby improving the visibility. Since human vision is less sensitive than the drive cycle of a display, a human perceives an image obtained by integrating and averaging the original image and the interpolation image.

Japanese Patent Laid-Open No. 2003-532145 proposes a method of improving image quality by performing correction such that the average luminance value between two consecutive subframes becomes equal to the original luminance value. However, with the method described in Japanese Patent Laid-Open No. 2003-532145, a memory for holding the luminance of the previous frame for one frame period is necessary, and this increases the circuit scale.

SUMMARY OF THE INVENTION

The present invention provides a technique advantageous in improving the quality of a display image with a simple arrangement.

One of aspects of the present invention provides a display device configured to display an image in which each frame is formed by at least two subframes, comprising: a drive unit configured to drive a plurality of pixels in a pixel array so as to drive pixels in at least two rows based on pixel data of each row of each supplied subframe data, wherein the drive unit drives the plurality of pixels so as to cause pixels in a row not matching a row in the supplied current subframe data to emit light with a first condition, and cause pixels in a row matching the row in the current subframe data to emit light with a second condition, the second condition is a condition in which a light emission amount is larger than in the first condition when causing the pixels to emit light in accordance with identical pixel values.

According to the present invention, a technique advantageous in improving the quality of a display image with a simple arrangement is provided.

Further features of the present invention will become apparent from the following description of exemplary embodiments with reference to the attached drawings.

BRIEF DESCRIPTION OF THE DRAWINGS

FIG. 7A is a view for comparing the operation in the comparative example and the operation in the first embodiment.

FIG. 7B is a view for comparing the operation in the comparative example and the operation in the first embodiment.

FIG. 7C is a view for comparing the operation in the comparative example and the operation in the first embodiment.

FIG. 7D is a view for comparing the operation in the comparative example and the operation in the first embodiment.

FIG. 7E is a view for comparing the operation in the comparative example and the operation in the first embodiment.

DESCRIPTION OF THE EMBODIMENTS

Preferred embodiments according to the present invention will now be described hereinafter with reference to the accompanying drawings. It is to be understood that the following embodiments are not intended to limit the claims of the present invention, and that not all of the combinations of the aspects that are described according to the following embodiments are necessarily required with respect to the means to solve the problems according to the present invention.

Figure 1:
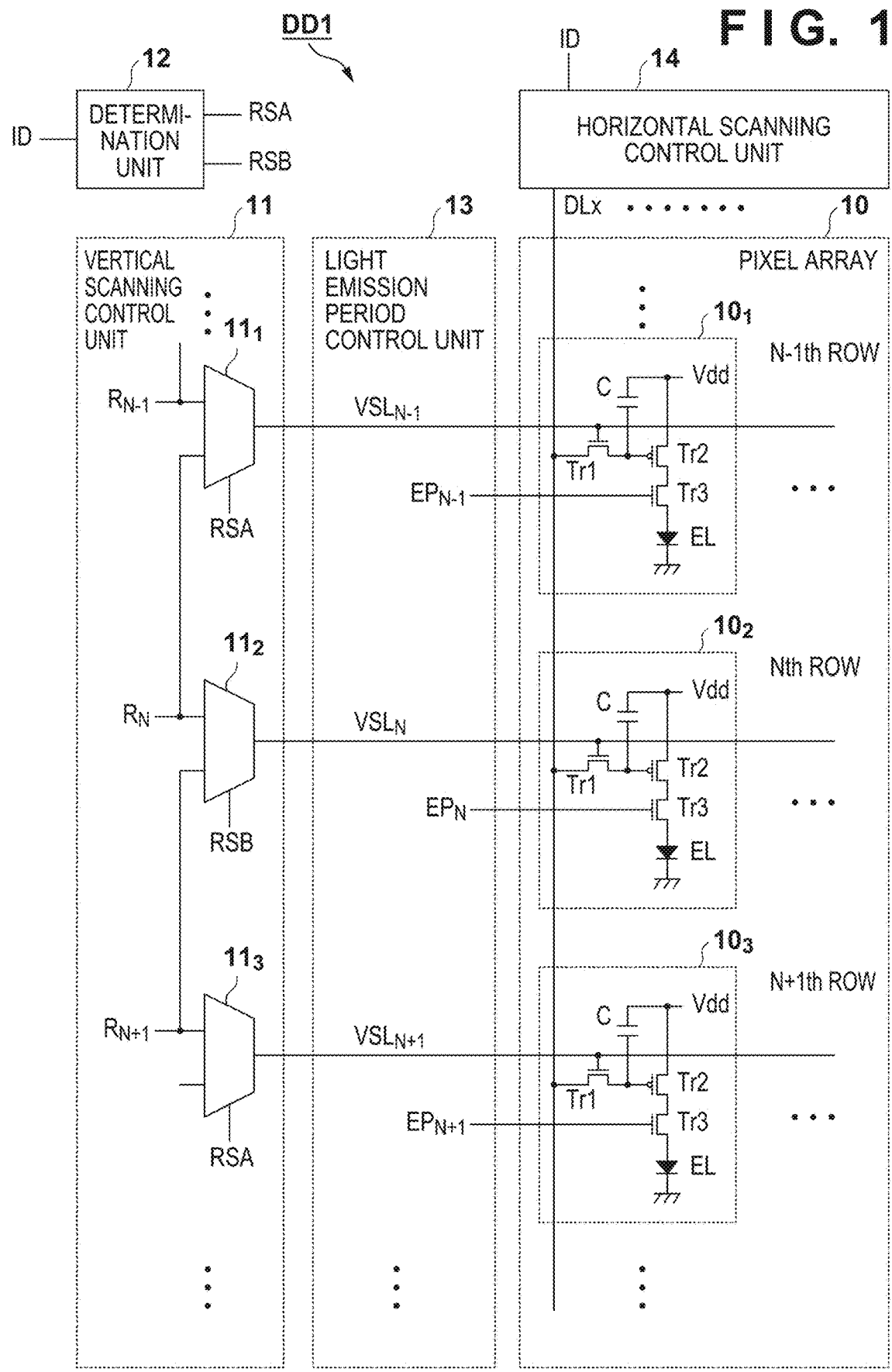
FIG. 1 is a view showing the arrangement of a display device according to a comparative example.

FIG. 1 shows the arrangement of a display device DD1 according to a comparative example. The display device DD1 has a function of displaying an image in which each frame is formed by at least two subframes. The display device DD1 can include a pixel array 10, a vertical scanning control unit 11, a determination unit 12, a light emission period control unit 13, and a horizontal scanning control unit 14. The display device DD1 can drive the pixel array 10 by a multi-line drive method for simultaneously driving pixels in at least two rows. For the sake of simplicity, an example will be described here in which pixels in two rows are simultaneously driven.

The pixel array 10 includes a plurality of pixels arranged so as to form a plurality of rows and a plurality of columns. In FIG. 1, pixels $10_1$, $10_2$, and $10_3$ arranged in the (N−1)th row, the Nth row, and the (N+1)th row, respectively, are representatively shown. When the plurality of pixels are described without being distinguished from each other, they will be described as pixels $10_x$. This also applies to other components. Each pixel $10_x$ can include transistors Tr1, Tr2, and Tr3, a capacitor C, and a light emitting element EL (for example, an organic EL element).

The gate of the transistor Tr1 is connected to a vertical scanning line $VSL_x$, ( ..., $VSL_{N−1}$, $VSL_N$, $VSL_{N+1}$) driven by the vertical scanning control unit 11. The vertical scanning line $VSL_x$ is activated when writing a pixel signal in the capacitor C through data $DL_x$ ($DL_1$, $DL_2$, ...) driven by the horizontal scanning control unit 14. The transistor Tr2 supplies, to the light emitting element EL, a current corresponding to the pixel signal written in the capacitor C. The gate of the transistor Tr3 is connected to a light emission period signal line $EP_x$ ( ..., $EP_{N−1}$, $EP_N$, $EP_{N+1}$) driven by the light emission period control unit 13 to control the light emission period of the light emitting element EL.

Image data ID of each frame supplied to the display device DD1 can include even-numbered subframe data which is data of an even-numbered subframe, and odd-numbered subframe data which is data of an odd-numbered subframe. When writing pixel data of the even-numbered subframe data, the transistors Tr1 of the pixels $10_1$ and $10_2$ in the (N−1)th and Nth rows are driven so that the pixels $10_1$ and $10_2$ in the (N−1)th and Nth rows are simultaneously driven. When writing pixel data of the odd-numbered subframe data, the transistors Tr1 of the pixels $10_2$ and $10_3$ in the Nth and (N+1)th rows are driven so that the pixels $10_2$ and $10_3$ in the Nth and (N+1)th rows are simultaneously driven. In order to implement this, the vertical scanning control unit 11 includes a plurality of selection units $11_x$ ($11_1$, $11_2$, and $11_3$).

The plurality of selection units $11_x$ can be arranged such that one selection unit $11_x$ is assigned to one row. The image data ID of each frame is supplied to the determination unit 12. For each frame, the determination unit 12 can determine one of two subframes forming the frame the supplied current subframe data belongs to, and output selection signals RAS and RSB indicating the result of the determination. The supplied current subframe data can be the even-numbered subframe data or the odd-numbered subframe data. The selection signals RSA and RSB are complementary or exclusive signals, and the selection signal RSB can be the inverted signal of the selection signal RSA. When writing the pixel data of the even-numbered subframe data, the determination unit 12 can drive the selection signal RSB to the active level and the selection signal RSA to the inactive level. When writing the pixel data of the odd-numbered subframe data, the determination unit 12 can drive the selection signal RSA to the active level and the selection signal RSB to the inactive level. If each frame is formed by at least two subframes, the determination unit 12 can be configured to determine one of the at least two subframes forming the frame the current subframe data belongs to.

Each selection unit $11_x$ of the vertical scanning control unit 11 can be formed by a multiplexer that outputs a signal having the same logic level as the input signal designated by the selection signal from the first and second input signals. The selection unit $11_x$, to which the selection signal RSA is input, can output a signal having the same logic level as the first input signal if the selection signal RSA is at the active level, and output a signal having the same logic level as the second input signal if the selection signal RSA is at the inactive level. The selection unit $11_x$, to which the selection signal RSB is input, can output a signal having the same logic level as the first input signal if the selection signal RSB is at the active level, and output a signal having the same logic level as the second input signal if the selection signal RSB is at the inactive level. Each selection unit $11_x$ drives the vertical scanning line $VSL_x$ in the corresponding row by the output thereof. For example, when writing the pixel data of the even-numbered subframe data, the selection unit $11_2$ assigned to the Nth row outputs a signal having the same logic level as a row selection signal R N to the vertical scanning signal line $VSL_N$.

In order to write a pixel signal in the capacitor C (that is, charge or discharge), which is used to control the light emission luminance of each pixel $10_x$, the horizontal scanning control unit 14 outputs the pixel signal to the data line $DL_x$ in each column. Here, when writing the pixel data of the even-numbered subframe data, a pixel signal $P_N$ corresponding to the pixel data of the Nth row of the even-numbered subframe data is written in the capacitors C of the pixels $10_1$ and $10_2$ in the (N−1)th and Nth rows. That is, the pixel signal $P_N$ corresponding to the pixel data of the Nth row is written in the capacitor C of the pixel $10_2$ in the Nth row, and the pixel signal $P_N$ corresponding to the pixel data for the pixel $10_2$ in the Nth row, which is adjacent to the pixel $10_1$, is also written in the capacitor C of the pixel $10_1$ in the (N−1)th row. When writing the pixel data of the odd-numbered subframe data, a pixel signal $P_{N+1}$ corresponding to the pixel data of the (N+1)th row of the odd-numbered subframe data is written in the capacitors C of the pixels $10_2$ and $10_3$ in the Nth and (N+1)th rows. That is, the pixel signal $P_{N+1}$ corresponding to the pixel data for the (N+1)th pixel $10_3$, which is adjacent to the pixel $10_2$, is written in the capacitor C of the pixel $10_2$ in the Nth row, and the pixel signal $P_{N+1}$ corresponding to the pixel data for the (N+1)th pixel $10_3$ is also written in the capacitor C of the pixel $10_2$ in the (N+1)th row.

According to the multi-line drive as described above, in two subframe periods, light emission of the pixel $10_2$ in the Nth row is perceived by the human as light emission corresponding to $P_N/2+P_{N+1}/2$. Here, assume that the image data ID is for a still image (repetition of a single image), and the luminance levels of the pixels in the (N−1)th, Nth, and (N+1)th rows are 20, 20, and 80, respectively. In this case, light emission of the pixel $10_2$ in the Nth row is perceived as the integrated average of 20, 20, and 80, that is, a luminance of 50. Accordingly, a deviation from the original pixel data having the luminance level of 20 occurs, and image quality degradation can occur.

Figure 4:
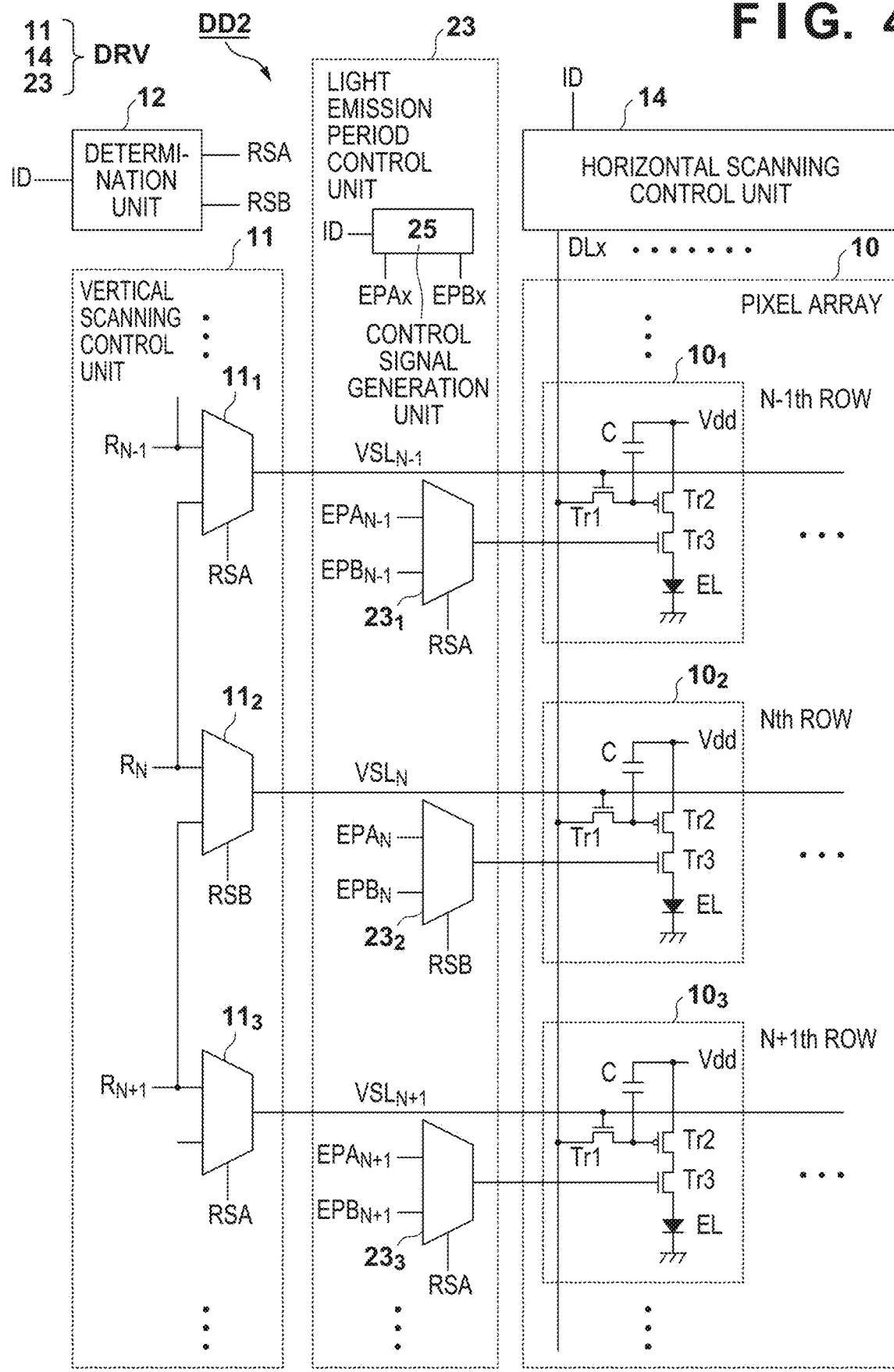
FIG. 4 is a view showing the arrangement of a display device according to the first embodiment.

With reference to FIG. 4, a display device DD2 according to the first embodiment will be described below. Note that matters not mentioned as the arrangement and operation of the display device DD2 according to the first embodiment can follow the arrangement and operation of the display device DD1 according to the comparative example described above. The display device DD2 according to the first embodiment can have a function of displaying an image in which each frame is formed by at least two subframes.

The display device DD2 can include a pixel array 10, a drive unit DRV configured to drive the pixel array 10, and a determination unit 12. The drive unit DRV can include a vertical scanning control unit 11, a light emission period control unit 23, and a horizontal scanning control unit 14. The display device DD2 can drive the pixel array 10 by a multi-line drive method for simultaneously driving pixels in at least two rows. For the sake of simplicity, an example will be described here in which pixels in two rows are simultaneously driven.

Figure 3:
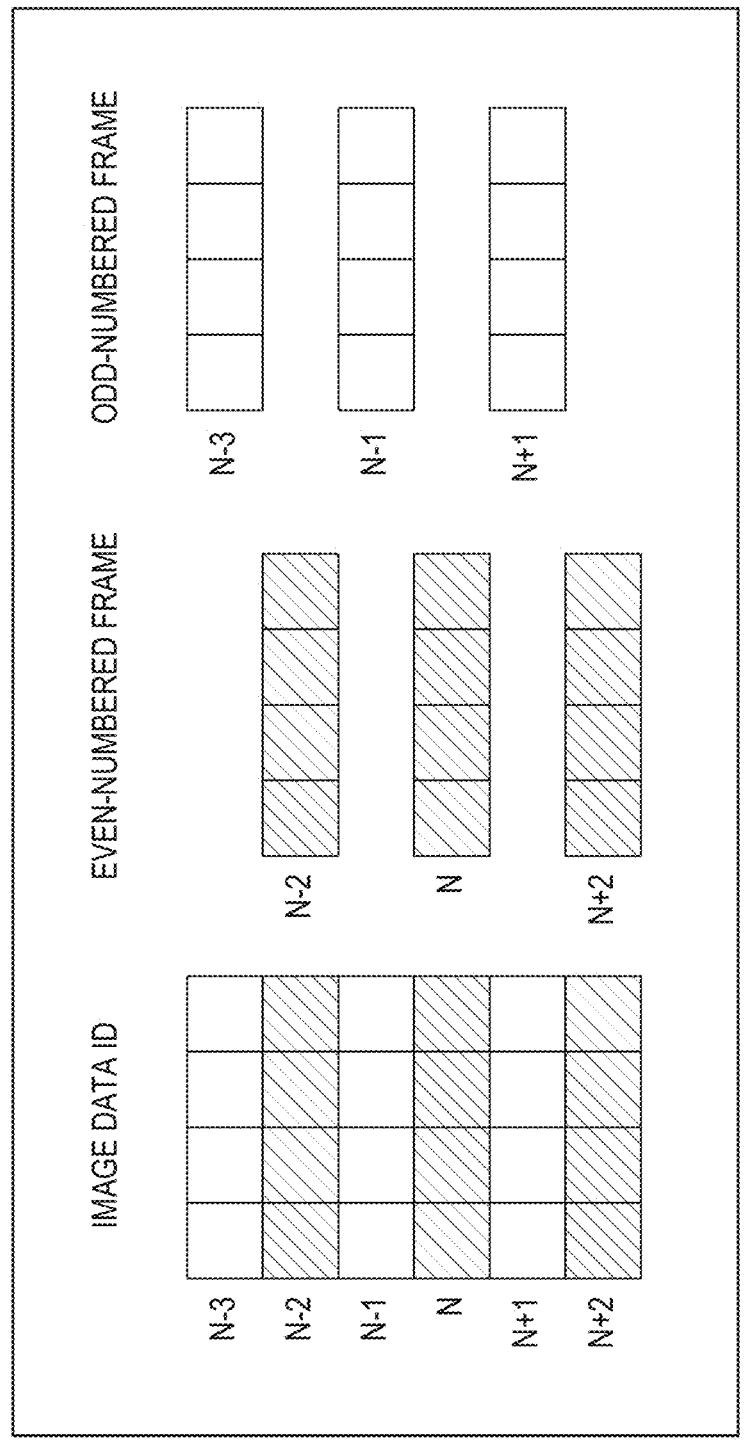
FIG. 3 is a view schematically showing image data supplied to the display device.

FIG. 3 schematically shows image data ID to be supplied to the display device DD2 (and the display device DD1). For the sake of simplicity, FIG. 3 shows the (N−3)th row, the (N−2)th row, the (N−1)th row, the Nth row, the (N+1)th row, and the (N+2)th row of one frame of the image data ID. The image data ID of one frame can be formed by two subframe data, more specifically, even-numbered subframe data and odd-numbered subframe data. The even-numbered subframe data can be formed by pixel data of the rows including the (N−2)th row, the Nth row, the (N+2)th row, and so on, and the odd-numbered subframe data can be formed by pixel data of the rows including the (N−3)th row, the (N−1)th row, the (N+1)th row, and so on.

For each frame, the determination unit 12 can determine, based on the image data ID or a signal accompanying the image data ID, one of at least two subframes (here, the even-numbered subframe and the odd-numbered subframe) forming the frame the supplied current subframe data belongs to. For example, if the image data ID is supplied as an interlace signal, this determination can be made using the characteristic that the start of scanning of a vertical synchronization signal is shifted by 0.5H. Alternatively, one of the even-numbered subframe data and the odd-numbered subframe data that is transmitted first at the start of transmission of the image data ID may be defined, and the determination can be made based on this. Alternatively, for example, if transmission is performed according to a standard such as MIPI or the like, it may be defined that, for example, the even-numbered subframe data is transferred in an event mode and the odd-numbered subframe data is transferred in a pulse mode, and the determination can be made based on this. Alternatively, determination information accompanying the image data may be transmitted as a sideband signal, and the determination can be made based on this. The determination may be made according to other methods. Based on the determination as described above, the determination unit 12 can generate selection signals RSA and RSB. When writing the pixel data of the even-numbered subframe data, the determination unit 12 can drive the selection signal RSB to the active level and the selection signal RSA to the inactive level. When writing the pixel data of the odd-numbered subframe data, the determination unit 12 can drive the selection signal RSA to the active level and the selection signal RSB to the inactive level. Since the selection signal RSA is driven to the active level in the odd-numbered subframe and the selection signal RSB is driven to the active level in the odd-numbered subframe, the selection signals RSA and RSB are alternately driven to the active level.

The vertical scanning control unit 11 generates a row selection signal $R_x$ for controlling vertical scanning (row selection) of the pixel array 10. The row selection signal $R_x$ can be formed by, for example, a shift register. The row selection signal $R_x$ can be driven to the active level in the order of $R_1$, $R_2$, . . . , $R_{N-1}$, $R_N$, $R_{N+1}$, and so on over a predetermined period. In multi-line drive, when writing the pixel data of the even-numbered subframe data in a pixel $10_x$, the vertical scanning control unit 11 can generate a vertical scanning signal such that pixels $10_1$ and $10_2$ in the (N−1)th and Nth rows are simultaneously driven. When writing the pixel data of the odd-numbered subframe data in the pixel $10_x$, the vertical scanning control unit 11 can generate a vertical scanning signal such that the pixel $10_2$ and a pixel $10_3$ in the Nth and (N+1)th rows are driven simultaneously.

When writing the pixel data of the even-numbered subframe data, a selection unit $11_1$ in the (N−1)th row can output, to a vertical scanning signal line $VSL_{N-1}$ in the (N−1)th row, a signal having the same logic level as a row selection signal $R_N$ of the Nth row in accordance with the selection signal RSA. Further, when writing the pixel data of the even-numbered subframe data, a selection unit $11_2$ in the Nth row can output, to a vertical scanning signal line $VSL_N$ in the Nth row, a signal having the same logic level as the row selection signal $R_N$ of the Nth row in accordance with the selection signal RSB.

When writing the pixel data of the odd-numbered subframe data, the selection unit $11_2$ in the Nth row can output, to the vertical scanning signal line $VSL_{N-}$ in the Nth row, a signal having the same logic level as a row selection signal $R_{N+1}$ of the (N+1)th row in accordance with the selection signal RSB. Further, when writing the pixel data of the odd-numbered subframe data, a selection circuit $11_3$ in the (N+1)th row can output, to a vertical scanning signal line $VSL_{N+1}$ in the (N+1)th row, a signal having the same logic level as the row selection signal $R_{N+1}$ of the (N+1)th row in accordance with the selection signal RSA.

The drive unit DRV can be configured to drive the pixels $10_x$ in at least two rows based on the pixel data of each row of each subframe data. The drive unit DVR can drive a plurality of the pixels $10_x$ so as to cause the pixel in a row not matching a row in the supplied current subframe data to emit light with a first condition, and cause the pixel in a row matching the row in the current subframe data to emit light with a second condition. The second condition can be a condition in which the light emission amount is larger than in the first condition when causing the pixels to emit light in accordance with identical pixel values. In the first embodiment, in the first condition, the light emission period for causing the pixel to emit light is a first light emission period, and in the second condition, the light emission period for causing the pixel to emit light is a second light emission period longer than the first light emission period.

The light emission period control unit 23 can control a transistor Tr3 of each of the plurality of the pixels $10_x$ so as to cause the pixel $10_x$ in the row not matching the row in the supplied current subframe data to emit light in accordance with the first light emission period. Further, the light emission period control unit 23 can control the transistors Tr3 of the plurality of the pixels 10x so as to cause the pixel in the row matching the row in the supplied current subframe data to emit light in accordance with the second light emission period.

The light emission period control unit 23 can include a period signal generation unit 25. The control signal generation unit 25 can generate a first period control signal EPAx that defines a first light emission period T1, and a second period control signal EPBx that defines a second light emission period T2 longer than the first light emission period T1. The light emission period control unit 23 can include a plurality of selection units $23_x$ ($23_1$, $23_2$, and $23_3$). The plurality of selection units $23_x$ can be arranged such that one selection unit $23_x$ is assigned to one row. Each selection unit $23_x$ can select, from the first period control signal EPBx that defines the first light emission period T1 and the second period control signal EPAx that defines the second light emission period T2 longer than the first light emission period T1 (a plurality of control signals including them), the period control signal corresponding the current subframe data, and output the selected period control signal. The transistor Tr3 of the pixel $10_x$ in each row can be controlled by the output of the corresponding selection unit among the plurality of selection units 23x.

In an example, the first light emission period T1 is a light emission period shorter than the light emission period in an optimized comparative example, and the second light emission period T2 is a light emission period longer than the light emission period in the comparative example. The average of the first light emission period T1 and the second light emission period T2 can match the light emission period in the comparative example. For example, assume a case in which, in order to suppress power consumption, the light emission period in the comparative example is designed to be 70% the longest period. In this case, for example, the first light emission period T1 can be 40% the longest period, and the second light emission period T2 can be 100% the smallest period. Alternatively, assume a case in which the light emission period in the comparative example is designed to be 90% the longest period. In this case, for example, the first light emission period T1 can be 80% the longest period, and the second light emission period T2 can be 100% the smallest period.

The first period control signal EPAx and the second period control signal EPBx may be generated so as to cause a light emitting element EL of the pixel $10_x$ to emit light continuously, or may be generated so as to cause the light emitting element EL of the pixel $10_x$ to emit light intermittently.

Figure 2:
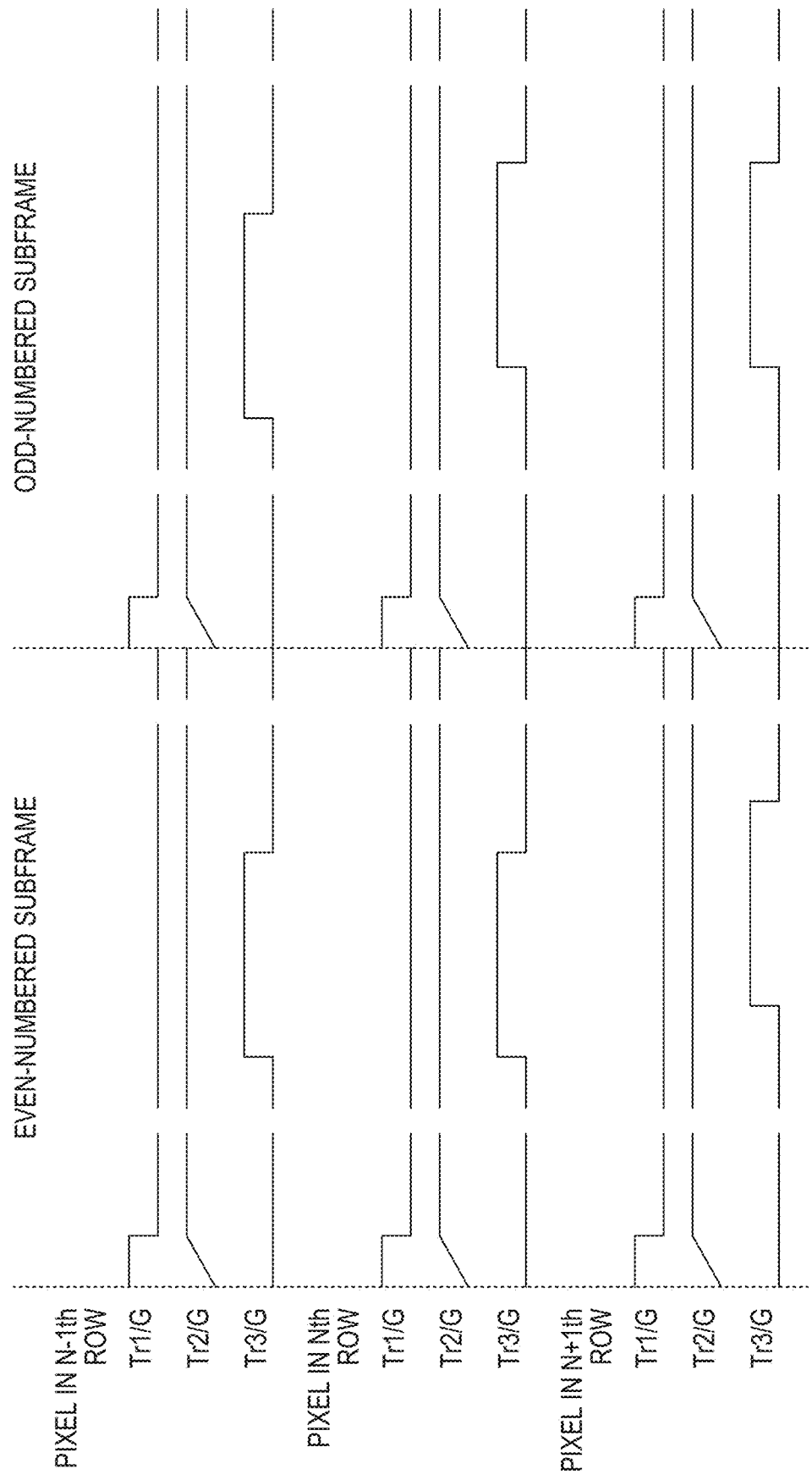
FIG. 2 is a view showing the operation of the display device according to the comparative example.
Figure 5:
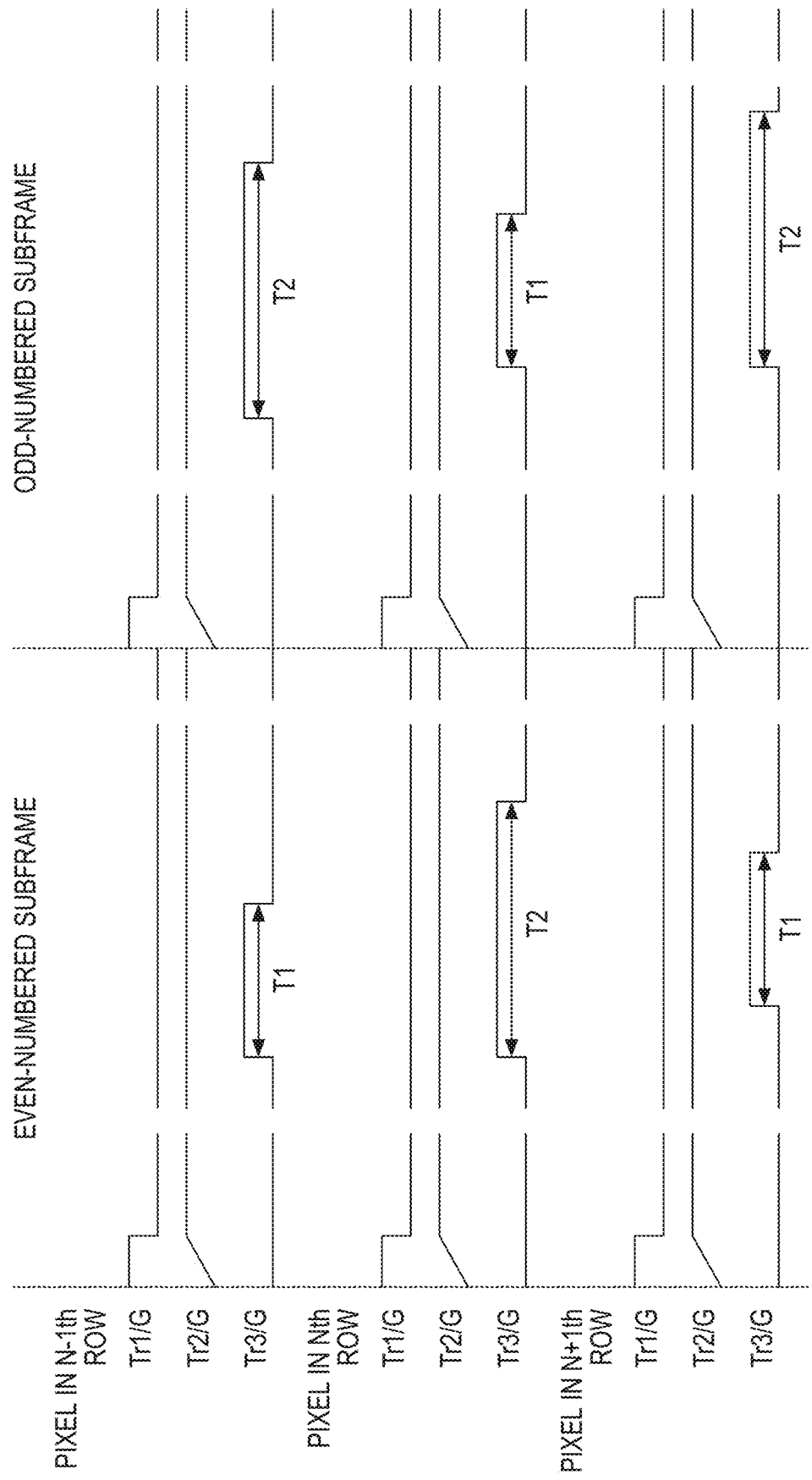
FIG. 5 is a view showing the operation of the displayed device according to the first embodiment.

FIG. 5 exemplarily shows drive of the pixel $10_x$ in the even-numbered subframe and the odd-numbered subframe by the display device DD2 according to the first embodiment. FIG. 2 exemplarily shows drive of the pixel $10_x$ in the even-numbered subframe and the odd-numbered subframe in the display device DD1 according to the comparative example. Tr1/G, Tr2/G, and Tr3/G indicate signals supplied to the gates of the transistors Tr1 and Tr2, and Tr3, respectively.

In the even-numbered subframe, the light emission period of the light emitting element EL of each of the pixels $10_1$ and $10_3$ in the (N−1)th and (N+1)th rows can be controlled in accordance with the first period control signal $EPA_x$ that defines the first light emission period T1 which is the relatively short light emission period. Further, in the even-numbered subframe, the light emission period of the light emitting element EL of the pixel $10_2$ in the Nth row can be controlled in accordance with the second period control signal $EPB_x$ that defines the second light emission period T2 which is the relatively long light emission period. On the other hand, in the odd-numbered subframe, the light emission period of the light emitting element EL of the pixel $10_2$ in the Nth row can be controlled in accordance with the first period control signal $EPA_x$ that defines the first light emission period T1 which is the relatively short light emission period. Further, in the odd-numbered subframe, the light emission period of the light emitting element EL of each of the pixels $10_1$ and $10_3$ in the (N−1)th and (N+1)th rows can be controlled in accordance with the second period control signal $EPB_x$ that defines the second light emission period T2 which is the relatively long light emission period.

The horizontal scanning control unit 14 can generate, based on the image data ID, a pixel signal (voltage signal) to be written in a capacitor C of the pixel $10_x$ in each column of the selected row, and output the pixel signal to a data line $DL_x$ in each column. Scanning of the pixel array 10 by the vertical scanning control unit 11 and output of the pixel signal to the data line $DL_x$ by the horizontal scanning control unit 14 can be controlled in synchronization with each other. In the multi-line drive, in each column, a single pixel signal can be written in two pixels $10_x$ adjacent to each other in the vertical direction.

Each pixel $10_x$ can control light emission of the light emitting element EL based on the vertical scanning signal from the vertical scanning control unit 11, the period control signal from the light emission period control unit 23, and the pixel signal from the horizontal scanning control unit 14. The light emission luminance of the light emitting element EL can be defined by the pixel signal (voltage signal) written in the capacitor C. The light emission period of the light emitting element EL can be controlled by the period control signals EPAx and EPBx.

Figure 6:
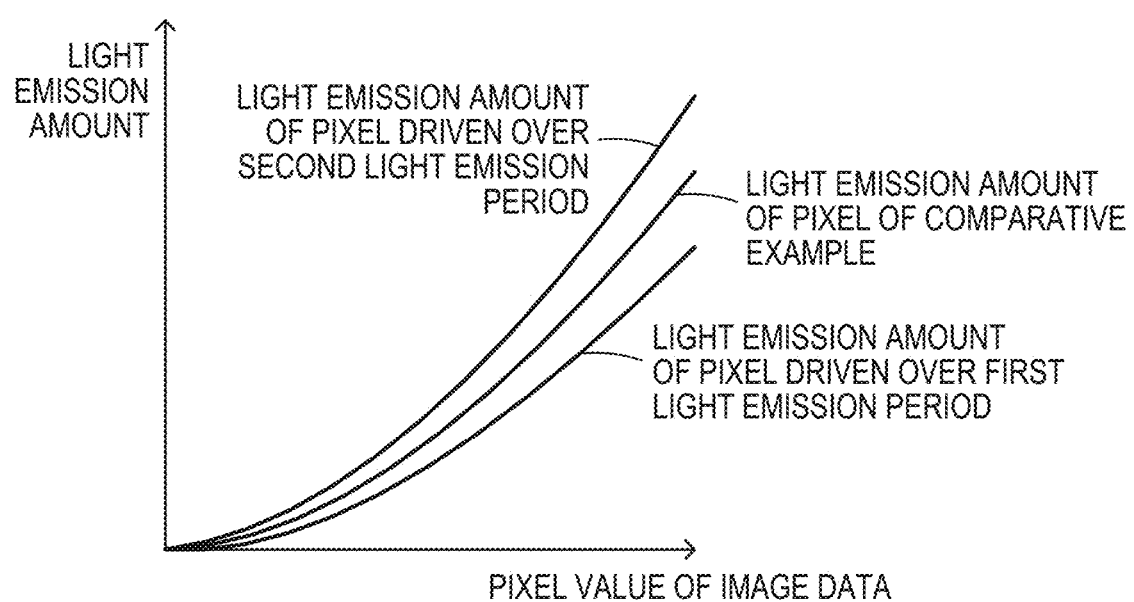
FIG. 6 is a view exemplarily showing light amounts in the comparative example and the first embodiment.

In the even-numbered subframe, the pixel signal for the pixel $10_2$ in the Nth row can be written in the capacitors C of the pixels $10_1$ and $10_2$ in the (N−1)th and Nth rows via the data line $DL_x$. Then, the light emission period of the light emitting element EL of the pixel $10_1$ in the (N−1)th row can be controlled over the first light emission period T1 defined by the first control signal $EPA_{N-1}$. The light emission period of the light emitting element EL of the pixel $10_2$ in the Nth row can be controlled over the second light emission period T2 defined by the second control signal $EPB_N$. As exemplarily shown in FIG. 6, the light emission amount of the light emitting element EL of the pixel $10_1$ in the (N−1)th row is larger than the light emission amount of the light emitting element EL of the pixel $10_1$ in the (N−1)th row that emits light over the first light emission period T1 defined by the first control signal $EPA_{N-1}$.

In the odd-numbered subframe, the pixel signal for the pixel $10_3$ in the (N+1)th row can be written in the capacitors C of the pixels $10_2$ and $10_3$ in the Nth and (N+1)th rows via the data line $DL_x$. Then, the light emission period of the light emitting element EL of the pixel $10_2$ in the Nth row can be controlled over the first light emission period T1 defined by the first control signal $EPA_N$. The light emission period of the light emitting element EL of the pixel $10_3$ in the (N+1)th row can be controlled over the second light emission period T2 defined by the second control signal $EPB_{N+1}$. The light emission period of the light emitting element EL of the pixel $10_3$ in the (N+1)th row can be controlled over the second light emission period T2 defined by the first control signal $EPA_{N+1}$. As exemplarily shown in FIG. 6, the light emission amount of the light emitting element EL of the pixel $10_3$ in the (N+1)th row is larger than the light emission amount of the light emitting element EL of the pixel $10_2$ in the Nth row that emits light over the first light emission period T1 defined by the first control signal $EPA_N$.

In FIGS. 7A to 7E, the multi-line drive in the comparative example and the multi-line drive in the first embodiment are compared. In this example, the first light emission period T1 is set to be 0.75 times the light emission period in the comparative example, and the second light emission period T2 is set to be 1.25 times the light emission period in the comparative example. The left column shows the comparative example, and the right column shows the embodiment.

Figures 7A, 7B, 7C:
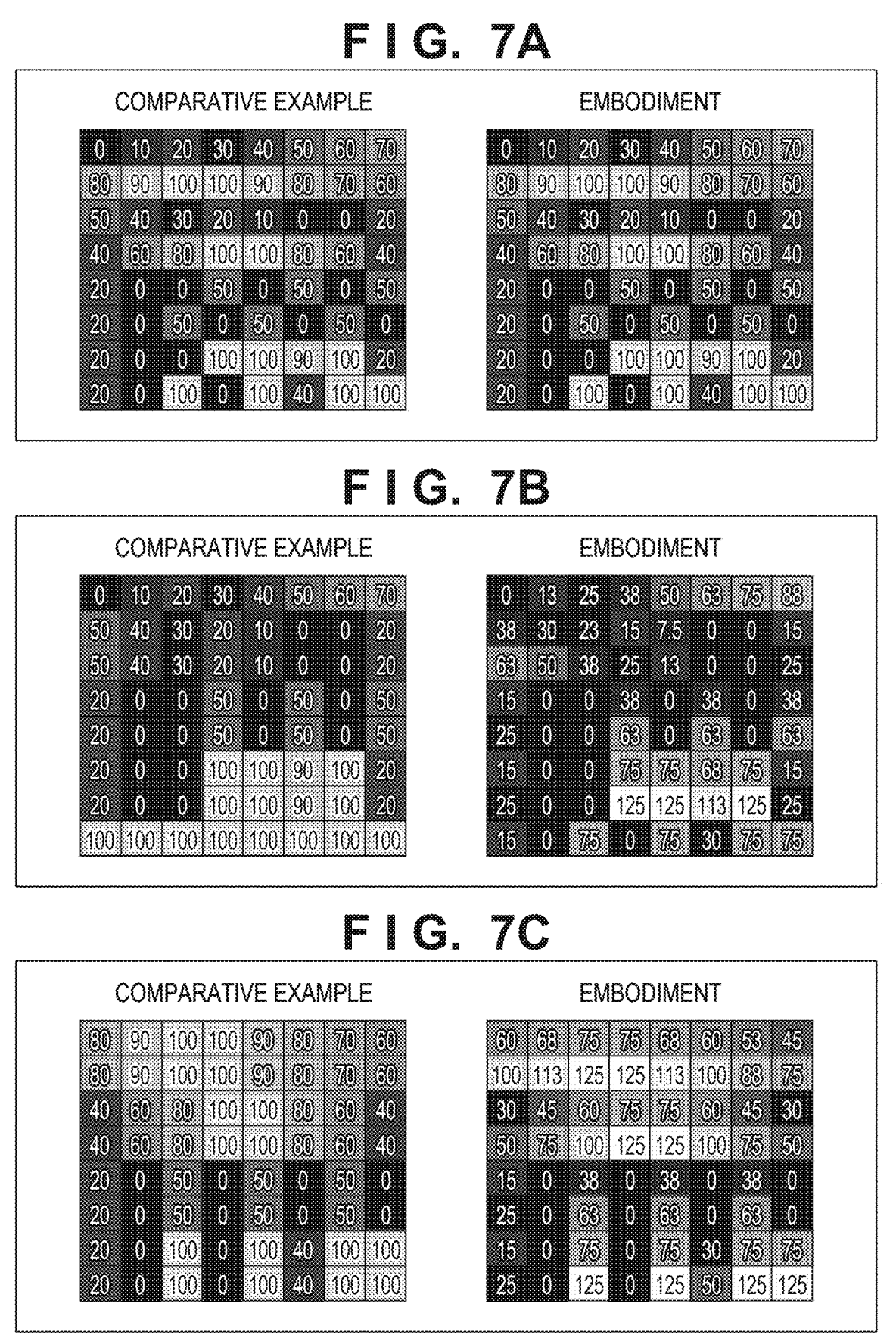

FIG. 7A shows the image data ID (original image), and there is no difference between the comparative example and the embodiment. FIG. 7B shows the display result of the even-numbered subframe, and FIG. 7C shows the display result of the odd-numbered subframe. FIG. 7D shows the integrated average image of FIG. 7B and FIG. 7C, that is, the result of visibility. FIG. 7E shows the absolute value of the difference between FIG. 7A and FIG. 7D. The average value of the difference absolute values shown in FIG. 7E is 21.3 in the comparative example and 15.9 in the first embodiment. The visual image quality has been improved in the first embodiment as compared to the comparative example.

If the first light emission period T1 is set to be 0.5 times the light emission period in the comparative example, and the second light emission period T2 is set to be 1.5 times the light emission period in the comparative example, the average value of the difference absolute values in the first embodiment is 10.6, and the higher effect is exhibited. However, if the ratio difference of each of the first light emission period T1 and the second light emission period T2 in the first embodiment with respect to the light emission period in the comparative example is increased, the fluctuation amount of the light emission luminance in one frame period increases, and this can be perceived as flicker. To prevent this, it is preferable to control with the upper limit of about 1.5 times, but the present invention is not limited to this.

In the first embodiment, the quality of a display image can be improved by using the supplied current subframe data alone. Accordingly, as compared to the method using a frame memory or the like, the quality of a display image can be improved with a simple arrangement.

In the description so far, for the sake of simplicity, an example has been described in which the light emission period of the pixel having the above-described structure is controlled. In addition to this, methods such as a method of generating, based on a triangular wave, a signal for controlling the light emission period are conceivable. In this case, it is possible to control the light emission period using a control method in which, upon generating the signal for controlling the light emission period, the threshold value for pulse conversion is changed for each row, or a method in which the tilt of the triangular wave is changed for each row.

The light emitting element EL may be an organic EL element, or may be another element. The light emitting element EL may be replaced with a liquid crystal element. In this case, a method is conceivable in which the luminance is adjusted by, for example, controlling the lighting period of a backlight for each row based on the period control signal in the first embodiment. By performing, in accordance with the light emission period, write for clearing electric charges held in the pixel capacitor at the time of driving the liquid crystal, and changing the light emission period for each row in accordance with the period control signal, a similar effect can be obtained.

The configuration has been described above in which the pixels in two rows are mainly driven using the pixel data of one row and the determination unit determines the even-numbered subframe data or the odd-numbered subframe data. However, by extending this embodiment, the present invention can be applied to a configuration for simultaneously driving pixels in more rows and a configuration using input data having two or more kinds of attributes.

Figure 8:
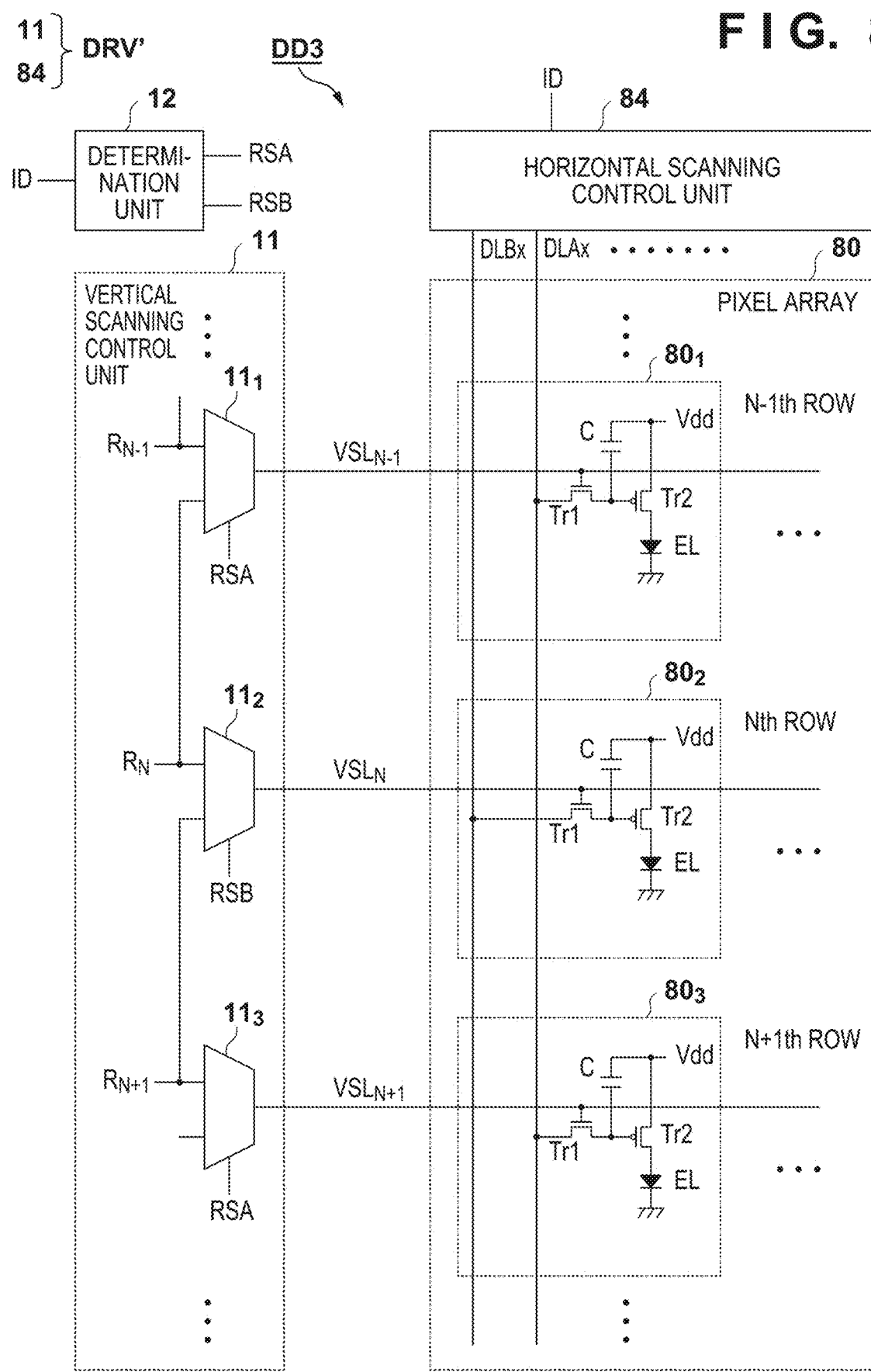
FIG. 8 is a view showing the arrangement of a display device according to the second embodiment.

With reference to FIG. 8, a display device DD3 according to the second embodiment will be described below. Note that matters not mentioned as the arrangement and operation of the display device DD3 according to the second embodiment can follow the arrangement and operation of the display device DD2 according to the first embodiment. The display device DD3 can have a function of displaying an image in which each frame is formed by at least two subframes. The display device DD3 can include a pixel array 80, a drive unit DRV' configured to drive the pixel array 80, and a determination unit 12. The drive unit DRV' can include a vertical scanning control unit 11 and a horizontal scanning control unit 84. The display device DD3 can drive the pixel array 80 by a multi-line drive method for simultaneously driving pixels in at least two rows. For the sake of simplicity, an example will be described here in which pixels in two rows are simultaneously driven.

The pixel array 80 includes a plurality of pixels arranged so as to form a plurality of rows and a plurality of columns. In FIG. 8, pixels $80_1$, $80_2$, and $80_3$ arranged in the (N−1)th row, the Nth row, and the (N+1)th row, respectively, are representatively shown. When the plurality of pixels are described without being distinguished from each other, they will be described as pixels $80_x$. This also applies to other components. Each pixel $80_x$ can include transistors Tr1 and Tr2, a capacitor C, and a light emitting element EL (for example, an organic EL element). The pixel $80_x$ in the display device DD3 according to the second embodiment can have a structure obtained by removing the transistor Tr3 from the pixel $10_x$ in the display device DD2 according to the first embodiment, but the pixel $80_x$ may also include the transistor Tr3. In this case, the display device DD3 can include the light emission period control unit 13 in the display device DD1 according to the comparative example.

The gate (Tr1/G) of the transistor Tr1 is connected to a vertical scanning line $VSL_x$ ( . . . , $VSL_{N-1}$, $VSL_N$, $VSL_{N+1}$) driven by the vertical scanning control unit 11. The vertical scanning line $VSL_x$ is activated when writing a pixel signal in the capacitor C through data $DLA_x$ and $DLB_x$ ($DLA_1$, $DLB_1$, $DLA_2$, $DLB_2$, . . . ) driven by the horizontal scanning control unit 84. The transistor Tr2 can supply, to the light emitting element EL, a current corresponding to the pixel signal written in the capacitor C.

The drive unit DRV' can be configured to drive the pixels 80x in at least two rows based on the pixel data of each row of each subframe data. The drive unit DVR' can drive a plurality of the pixels 80x so as to cause the pixel in a row not matching a row in the supplied current subframe data to emit light with a first condition, and cause the pixel in a row matching the row in the current subframe data to emit light with a second condition. The second condition can be a condition in which the light emission intensity (luminance) is higher than in the first condition.

The horizontal scanning control unit 84 forming a part of the drive unit DRV' can include the first data line $DLA_x$ configured to supply a pixel signal to the pixel in the row not matching the row in the first subframe data of at least two subframe data. The horizontal scanning control unit 84 can also include the second data line $DLB_x$ configured to supply a pixel signal to the pixel in the row matching the row in the second subframe data of at least two subframe data. More specifically, the horizontal scanning control unit 84 can include the first data line $DLA_x$ configured to supply a pixel signal to the pixels $80_1$ and $80_3$ in the (N−1)th row not matching the Nth row in the odd-numbered subframe data among the even-numbered subframe data and the odd-numbered subframe data. The horizontal scanning control unit 84 can also include the second data line $DLB_x$ configured to supply a pixel signal to the pixel $80_2$ in the Nth row matching the Nth row in the even-numbered subframe data among the even-numbered subframe data and the odd-numbered subframe data. In each column, the pixel $80_x$ connected to the first data line $DLA_x$ and the pixel $80_x$ connected to the second data line $DLB_x$ can be alternately arranged.

When writing the pixel data of the even-numbered subframe data, the transistors Tr1 of the pixels $80_1$ and $80_2$ in the (N−1)th and Nth rows can be driven so that the pixels $80_1$ and $80_2$ in the (N−1)th and Nth rows are simultaneously driven. When writing the pixel data of the odd-numbered subframe data, the transistors Tr1 of the pixels $80_2$ and $80_3$ in the Nth and (N+1)th rows can be driven so that the pixels $80_2$ and $80_3$ in the Nth and (N+1)th rows are simultaneously driven. In order to implement this, the vertical scanning control unit 11 includes a plurality of selection units $11_x$ ($11_1$, $11_2$, and $11_3$).

When writing the pixel data of the even-numbered subframe data, the horizontal scanning control unit 84 generates pixel signals to be supplied to the first data line $DLA_x$ and the second data line $DLB_x$, respectively, based on the pixel data of the Nth row of the image data ID. At this time, the horizontal scanning control unit 84 generates the pixel signals to be supplied to the first data line $DLA_x$ and the second data line $DLB_x$, respectively, so as to satisfy the first condition and the second condition. More specifically, when writing the pixel data of the even-numbered subframe data, the horizontal scanning control unit 84 can make the value of the pixel signal to be supplied to the second data line $DLB_x$ larger than the value of the pixel signal to be supplied to the first data line $DLA_x$. More specifically, if the pixel data of the Nth row is d, the horizontal scanning control unit 84 can supply the pixel signal corresponding to d−α (α is a positive numeric value) to the first data line $DLA_x$, and supply the pixel signal corresponding to d+β (β is a positive numeric value) to the second data line DLBx. Here, the value of β may be equal to or different from the value of α. The pixel signal supplied to the first data line $DLA_x$ is written in the capacitor C of the pixel $80_1$ in the (N−1)th row via the transistor Tr1 of the pixel $80_1$ in the (N−1)th row. The pixel signal supplied to the second data line $DLB_x$ is written in the capacitor C of the pixel $80_2$ in the Nth row via the transistor Tr1 of the pixel $80_2$ in the Nth row. With this, in the even-numbered subframe, the light emission intensity of the pixel $80_2$ in the (N−1)th row driven in accordance with the pixel data of the Nth row becomes higher than the light emission intensity of the pixel $80_1$ in the (N−1)th row driven in accordance with the pixel data of the Nth row.

When writing the pixel data of the odd-numbered subframe data, the horizontal scanning control unit 84 generates pixel signals to be supplied to the first data line $DLA_x$ and the second data line $DLB_x$, respectively, based on the pixel data of the (N+1)th row of the image data ID. At this time, the horizontal scanning control unit 84 generates the pixel signals to be supplied to the first data line $DLA_x$ and the second data line $DLB_x$, respectively, so as to satisfy the first condition and the second condition. More specifically, when writing the pixel data of the odd-numbered subframe data, the horizontal scanning control unit 84 can make the value of the pixel signal to be supplied to the first data line $DLA_x$ larger than the value of the pixel signal to be supplied to the second data line $DLB_x$. More specifically, if the pixel data of the (N+1)th row is d, the horizontal scanning control unit 84 can supply the pixel signal corresponding to d+β (β is the positive numeric value) to the first data line $DLA_x$, and supply the pixel signal corresponding to d−α (α is the positive numeric value) to the second data line $DLB_x$. Here, the value of β may be equal to or different from the value of α. The pixel signal supplied to the first data line $DLA_x$ is written in the capacitor C of the pixel $80_3$ in the (N+1)th row via the transistor Tr1 of the pixel $80_3$ in the (N+1)th row. The pixel signal supplied to the second data line $DLB_x$ is written in the capacitor C of the pixel $80_2$ in the Nth row via the transistor Tr1 of the pixel $80_2$ in the Nth row. With this, in the odd-numbered subframe, the light emission intensity of the pixel $80_3$ in the (N+1)th row driven in accordance with the pixel data of the (N+1)th row becomes higher than the light emission intensity of the pixel $80_2$ in the Nth row driven in accordance with the pixel data of the (N+1)th row.

The processing of deciding the pixel signals to be supplied to the first data line $DLA_x$ and the second data line $DLB_x$, respectively, based on the pixel data of each row (and each column) of the image data ID can also be understood as correction processing for obtaining the pixel signals by correcting the data. This correction processing can be processing of performing linear or nonlinear correction on the pixel data of each row of the image data ID.

Figure 9:
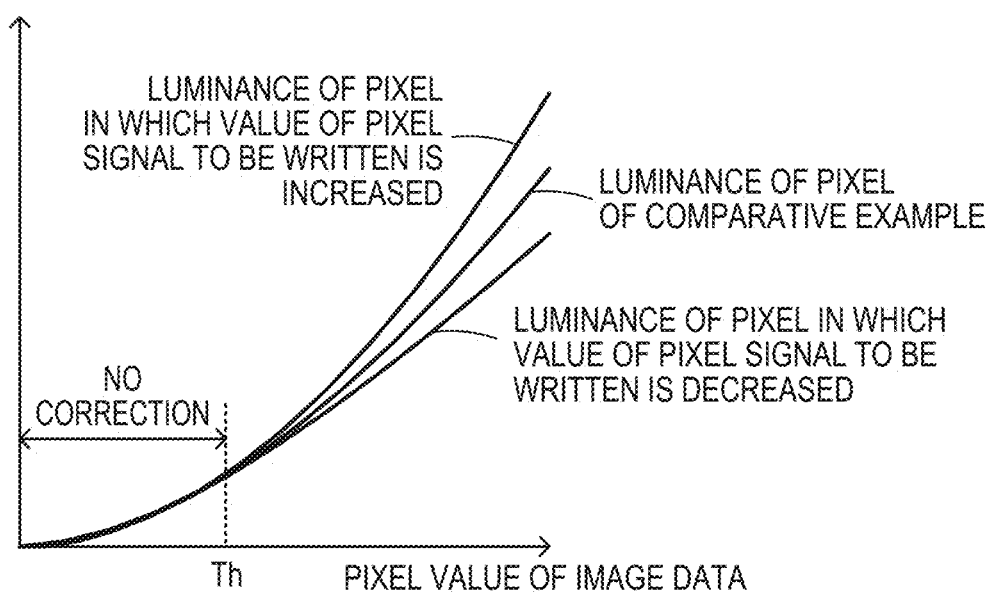
FIG. 9 is a view showing the operation of the display device according to the second embodiment.

Here, when the pixel in the Nth row of the image data ID (original image) is a pixel in a low-luminance region, if the pixel signal is generated by performing correction so as to increase the pixel value of the pixel in the even-numbered field, an unnatural display image can be generated. Therefore, for the pixel in the low-luminance region, it is preferable to generate the pixel signal so as to suppress the luminance to be equal to or lower than the luminance in the original image. For example, for data having the pixel value (luminance value) equal to or smaller than a threshold value Th shown in FIG. 9, the value without the above-described correction may be output to the data line. The above-described correction can be performed to prevent generation of luminance steps, that is, to allow the luminance to gradually change.

According to the first and second embodiments, the pixel in the row not matching the row in the supplied current subframe data is caused to emit light with the first condition, and the pixel in the row matching the row in the current subframe data is caused to emit light with the second condition in which the light emission amount is larger than in the first condition. With this, the quality of a display image in multi-line drive can be improved. In addition, in the second embodiment, arbitrary correction processing can be employed, so that a further improvement in quality of a display image can be expected.

It can also be said that the display device according to each of the first and second embodiments is a display device that uses image data in which one frame is formed by at least two subframes, and drives a plurality of rows including a first row using data based on single data, wherein the one frame includes a first subframe for which the first row and another row among the plurality of rows are driven using data based on drive data of the first row, and a second subframe for which the first row and another row among the plurality of rows are driven using data based on drive data of the other row, and a light emission amount of at least one pixel included in the first row in the first subframe is larger than a light emission amount thereof in the second subframe.

Figure 10:
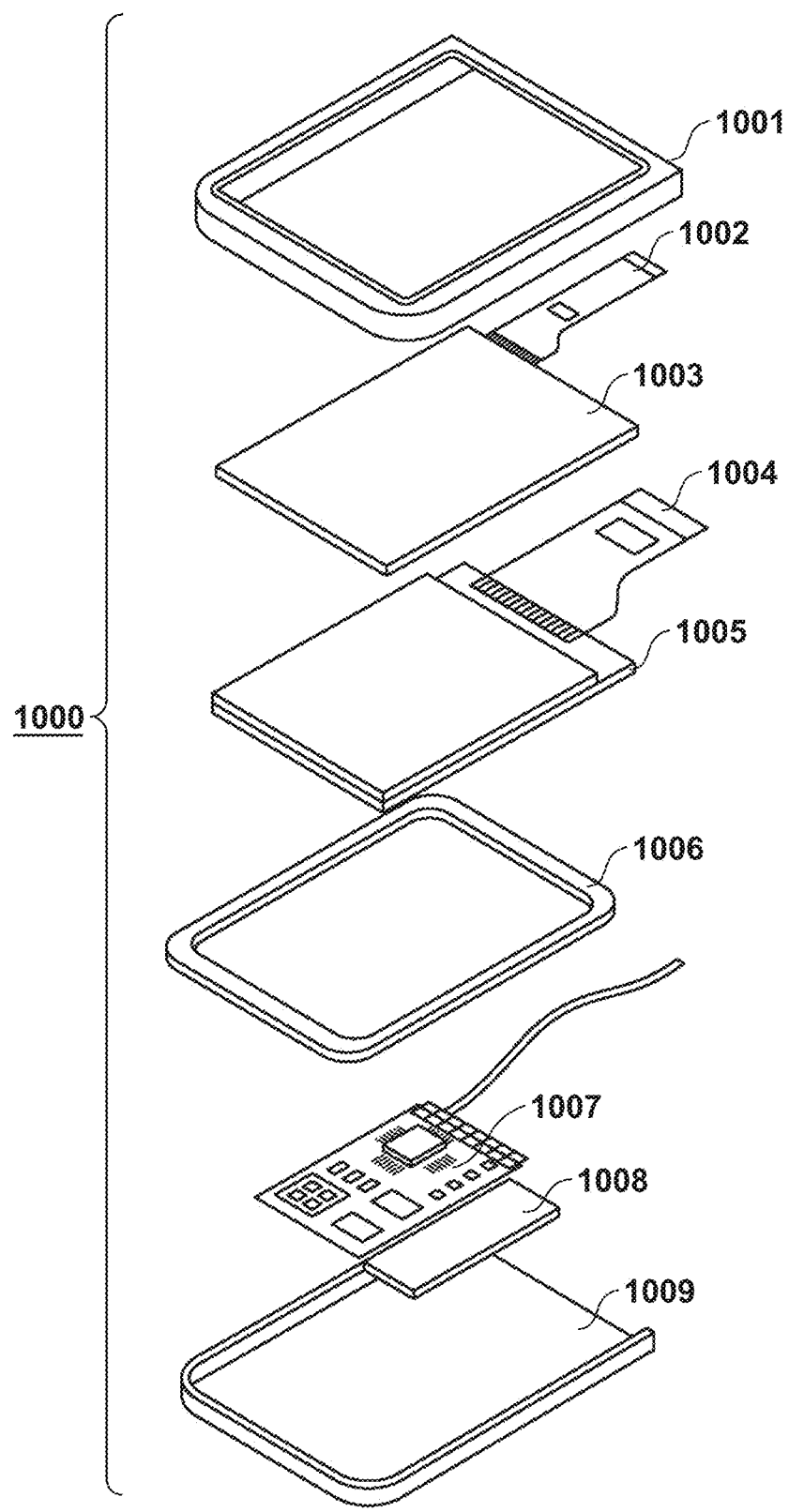
FIG. 10 is a view showing an application example of the display device according to the embodiment.

FIG. 10 is a schematic view showing an application example of the first and second display devices DD2 and DD3 described above. A display apparatus 1000 may include a touch panel 1003, a display panel 1005 formed by a display device represented by the display device DD2 or DD3, a frame 1006, a circuit board 1007, and a battery 1008 between an upper cover 1001 and a lower cover 1009. Flexible printed circuits FPC 1002 and 1004 are respectively connected to the touch panel 1003 and the display panel 1005. Transistors are printed on the circuit board 1007. The battery 1008 is unnecessary if the display apparatus 1000 is not portable equipment. Even when the display apparatus 1000 is portable equipment, the battery 1008 may be provided at another position.

The display device according to this embodiment may be used for a display unit of an image capturing apparatus that includes an optical unit including a plurality of lenses and an image sensor that receives light passing through the optical unit. The image capturing apparatus may include the display unit that displays information acquired by a plurality of image sensors included in an image capturing unit. Alternatively, information may be acquired using the information acquired by the image sensor, and the display unit may display information different from the information acquired by the image sensor. The image capturing apparatus may be a digital camera or a digital video camera.

Figure 11A:
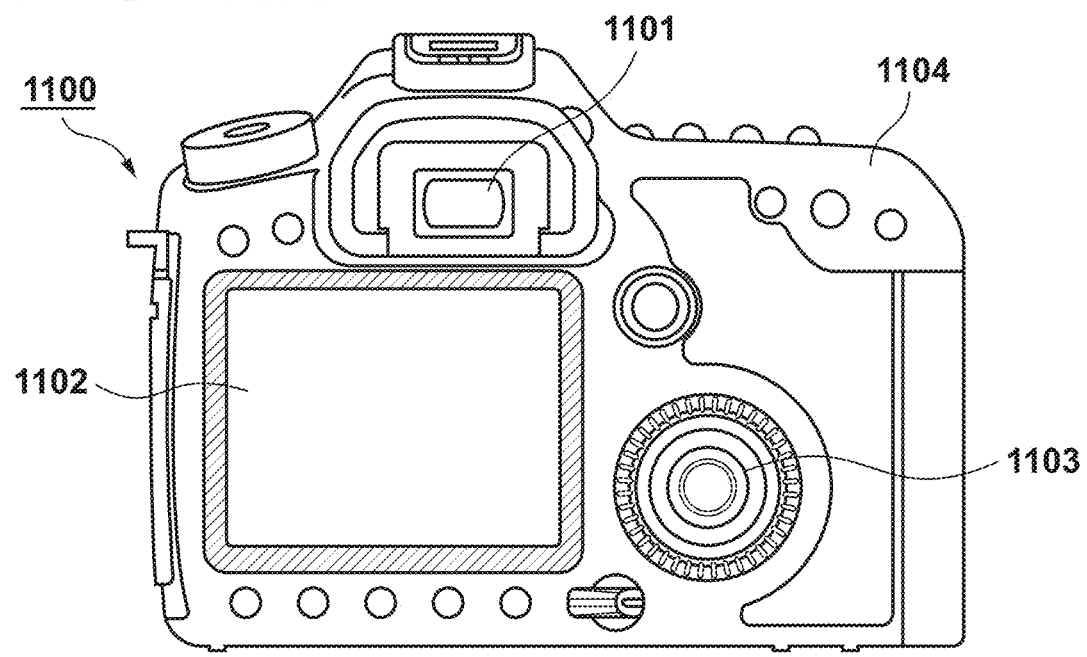
FIG. 11A is a view showing an application example of the display device according to the embodiment.

FIG. 11A is a schematic view showing an example of an image capturing apparatus according to one embodiment. An image capturing apparatus 1100 may include a viewfinder 1101, a rear display 1102, an operation unit 1103, and a housing 1104. The viewfinder 1101 can include a display unit formed by a display device represented by the display device DD2 or DD3. In this case, the display device may display not only an image to be captured, but also environment information, an image capturing instruction, and the like. The environment information may include the intensity of ambient light, the direction of ambient light, the moving speed of an object, the possibility that the object is blocked by a shielding object, or the like.

Since the timing suitable for capturing an image is a short time, it is preferable to display the information as quickly as possible. Therefore, it is preferable to use the display device according the above-described embodiment. The light emitting element can be formed by an organic light emitting element having a high response speed.

The image capturing apparatus 1100 includes an optical unit (not shown). The optical unit includes a plurality of lenses and forms an image on an image sensor housed in the housing 1104. It is possible to adjust the focus by adjusting the relative positions of the plurality of lenses. This operation can be performed automatically. The display device according to the embodiment may include a color filter having red, green, and blue colors. In the color filter, the red, green, and blue colors may be arranged in a delta arrangement. The display device according to the embodiment may be used for the display unit of a mobile terminal. In this case, both a display function and an operation function may be provided. Examples of the mobile terminal include a mobile phone such as a smartphone, a tablet, and a head mounted display.

Figure 11B:
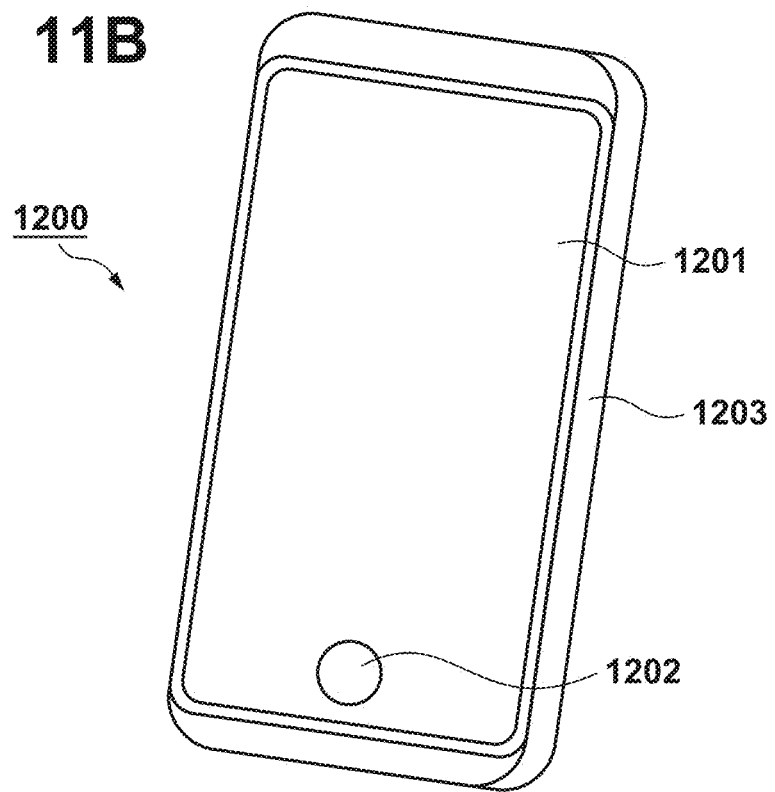
FIG. 11B is a view showing an application example of the display device according to the embodiment.

FIG. 11B is a schematic view showing an example of electronic equipment according to one embodiment. Electronic equipment 1200 includes a display unit 1201 formed by a display device represented by the display device DD2 or DD3, an operation unit 1202, and a housing 1203. The housing 1203 may include a circuit, a printed board including the circuit, a battery, and a communication unit. The operation unit 1202 may be a button or a touch panel type sensing unit. The operation unit may be a biometrics unit that recognizes a fingerprint and releases a lock or the like. Electronic equipment including a communication unit can also be called communication equipment.

Figure 12A:
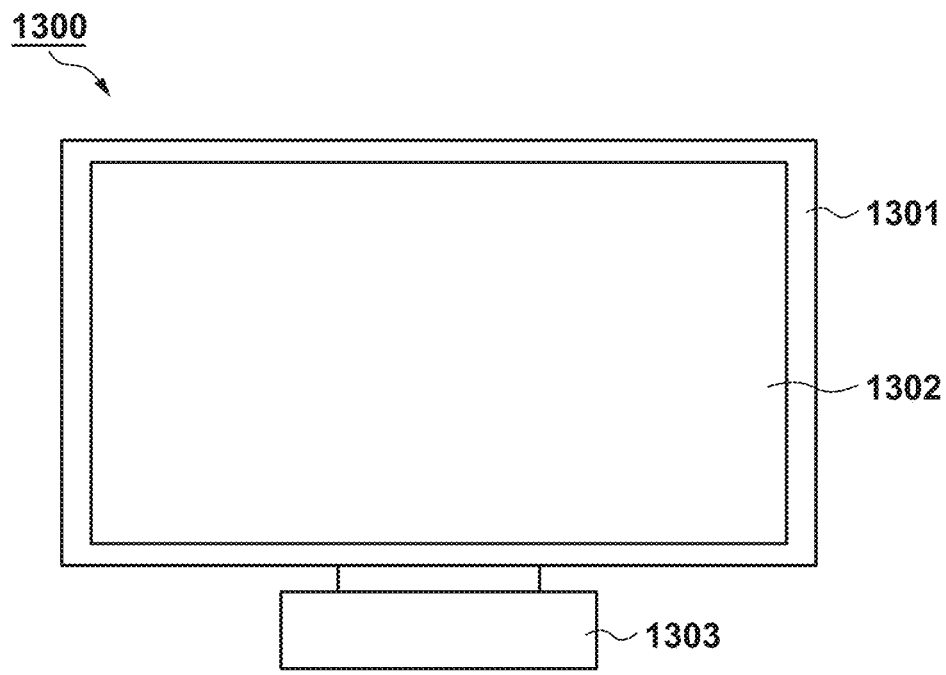
FIG. 12A is a view showing an application example of the display device according to the embodiment.
Figure 12B:
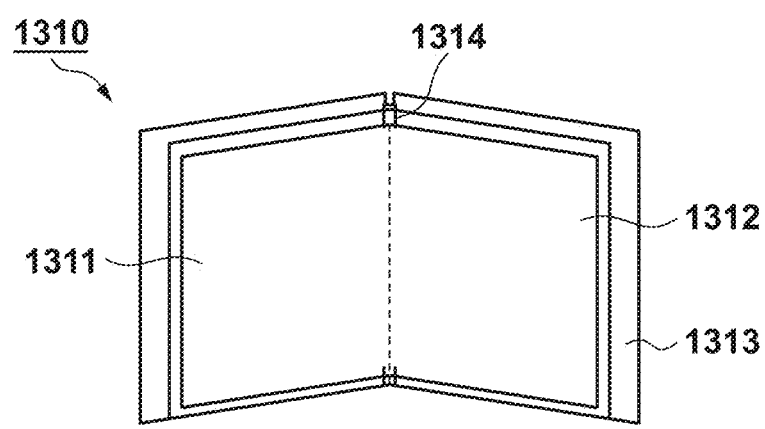
FIG. 12B is a view showing an application example of the display device according to the embodiment.

FIGS. 12A and 12B are schematic views each showing an example of a display apparatus according to one embodiment. FIG. 12A shows a display apparatus such as a television monitor or a PC monitor. A display apparatus 1300 includes a frame 1301 and a display unit 1302. The display unit 1302 can be formed by a display device represented by the display device DD2 or DD3. The display apparatus 1300 includes a base 1303 that supports the frame 1301 and the display unit 1302. The base 1303 is not limited to the form shown in FIG. 12A. The lower side of the frame 1301 may serve as the base. The frame 1301 and the display unit 1302 may be bent. The curvature radius may be between 5,000 mm (inclusive) and 6,000 mm (inclusive).

FIG. 12B is a schematic view showing another example of the display apparatus according to the embodiment. A display apparatus 1310 shown in FIG. 12B is configured to be bendable, and is a so-called foldable display apparatus. The display apparatus 1310 includes a first display unit 1311, a second display unit 1312, a housing 1313, and a bending point 1314. A display device represented by the display device DD2 or DD3 can be applied to each of the first display unit 1311 and the second display unit 1312. The first display unit 1311 and the second display unit 1312 may be one seamless display device. The first display unit 1311 and the second display unit 1312 can be divided at the bending point. The first display unit 1311 and the second display unit 1312 may display different images, or one image may be displayed with the first and second display units.

Figure 13A:
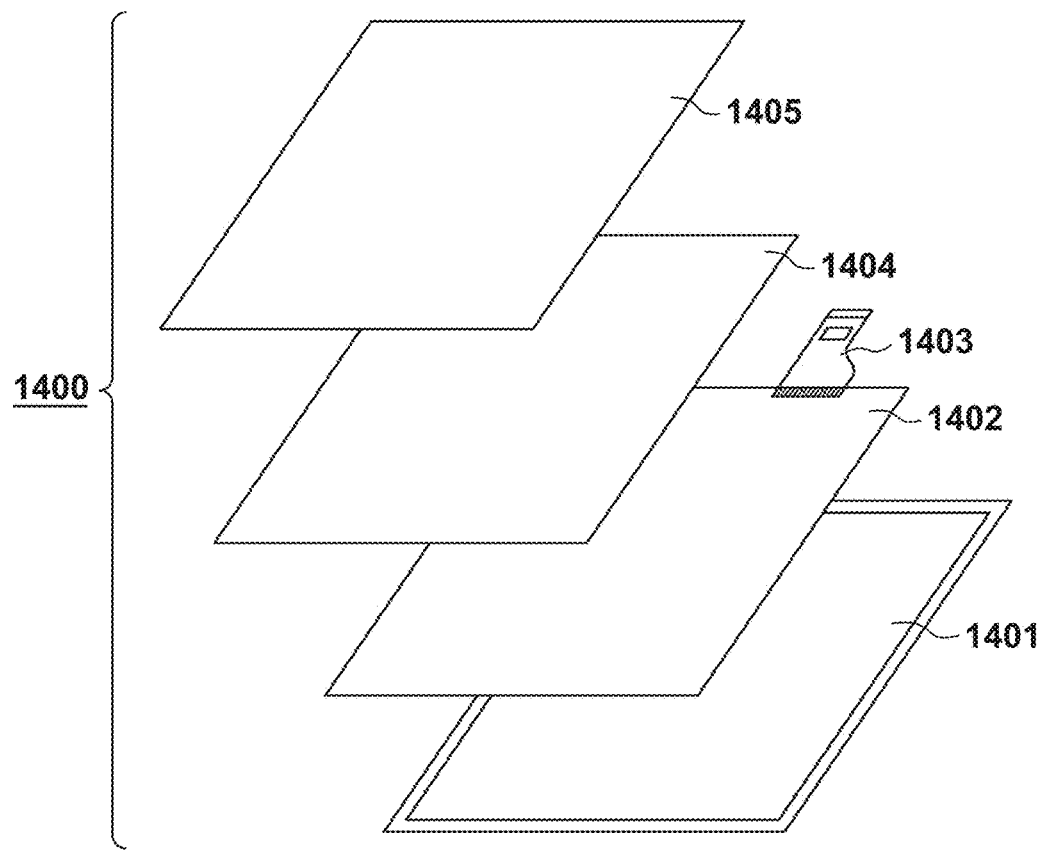
FIG. 13A is a view showing an application example of the display device according to the embodiment.

FIG. 13A is a schematic view showing an example of an illumination apparatus according to one embodiment. An illumination apparatus 1400 may include a housing 1401, a light source 1402, a circuit board 1403, an optical film 1404, and a light diffusion unit 1405. The light emitting device 100 can be applied to the light source 1402. The optical filter may be a filter that improves the color rendering property of the light source. The light diffusion unit can effectively diffuse light from the light source to illuminate a wide range for lighting up or the like. The optical filter and the light diffusion unit may be provided on the illumination light emission side. A cover may be provided in the outermost portion, as needed.

The illumination apparatus is, for example, an apparatus that illuminates a room. The illumination apparatus may emit light of white, day white, or any other color from blue to red. A light control circuit for controlling the light color may be provided. The illumination apparatus may include the organic light emitting element according to the present invention and a power supply circuit connected thereto. The power supply circuit is a circuit that converts an AC voltage into a DC voltage. Note that white light has a color temperature of 4200K, and day-white light has a color temperature of 5000K. The illumination apparatus may include a color filter. Further, the illumination apparatus according to this embodiment may include a heat dissipation portion. The heat dissipation portion releases the heat in the apparatus to the outside of the apparatus, and examples thereof include a metal having high specific heat, liquid silicon, and the like.

Figure 13B:
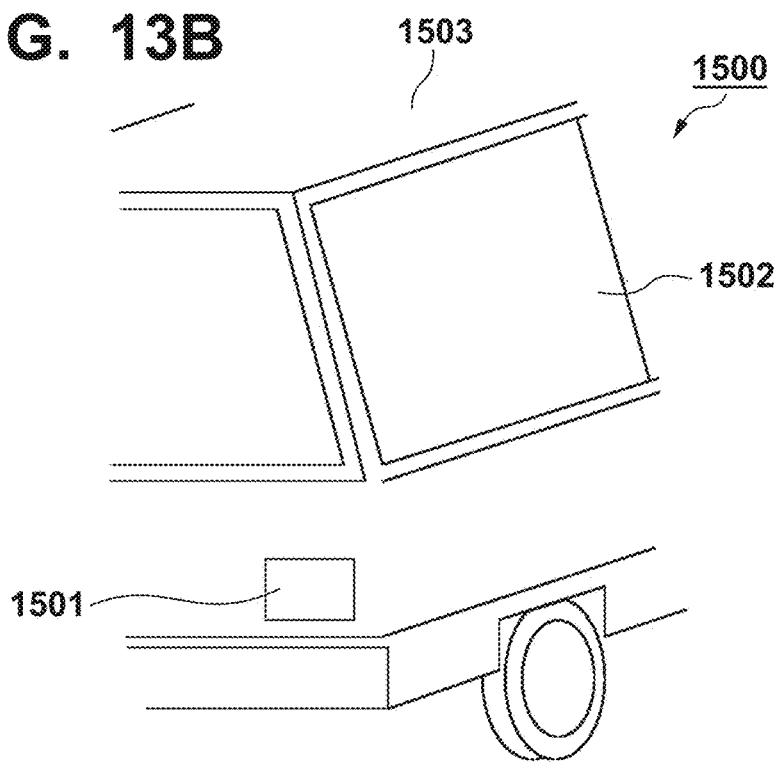
FIG. 13B is a view showing an application example of the display device according to the embodiment.

FIG. 13B is a schematic view showing an automobile which is an example of a moving body according to one embodiment. The automobile includes a tail lamp which is an example of the lighting unit. An automobile 1500 includes a tail lamp 1501, and may turn on the tail lamp when a brake operation or the like is performed. A display panel formed by a display device represented by the display device DD2 or DD3 can be applied to the tail lamp 1501. The tail lamp may include a protective member that protects the light emitting element. The protective member has a certain degree of strength, and can be made from any material as long as it is transparent, but is preferably made from polycarbonate or the like. Furandicarboxylic acid derivative, acrylonitrile derivative, or the like may be mixed with polycarbonate.

The automobile 1500 may include a body 1503 and windows 1502 attached thereto. The window may be a transparent display as long as it is not a window for checking the front or rear of the automobile. The light emitting device 100 can be applied to the transparent display. In this case, the components such as the electrodes included in the organic light emitting element are formed by transparent members. The moving body according to this embodiment may be a ship, an aircraft, a drone, or the like. The moving body may include a body and a lighting unit provided in the body. The lighting unit may emit light to inform the position of the body. A display panel formed by a display device represented by the display device DD2 or DD3 can be applied to the lighting unit.

Application examples of the display device according to the embodiments described above will be described with reference to FIGS. 14A and 14B. The display device is applicable to, for example, a system that can be worn as a wearable device such as smart glasses, an HMD, smart contact lenses, or the like.

Figure 14A:
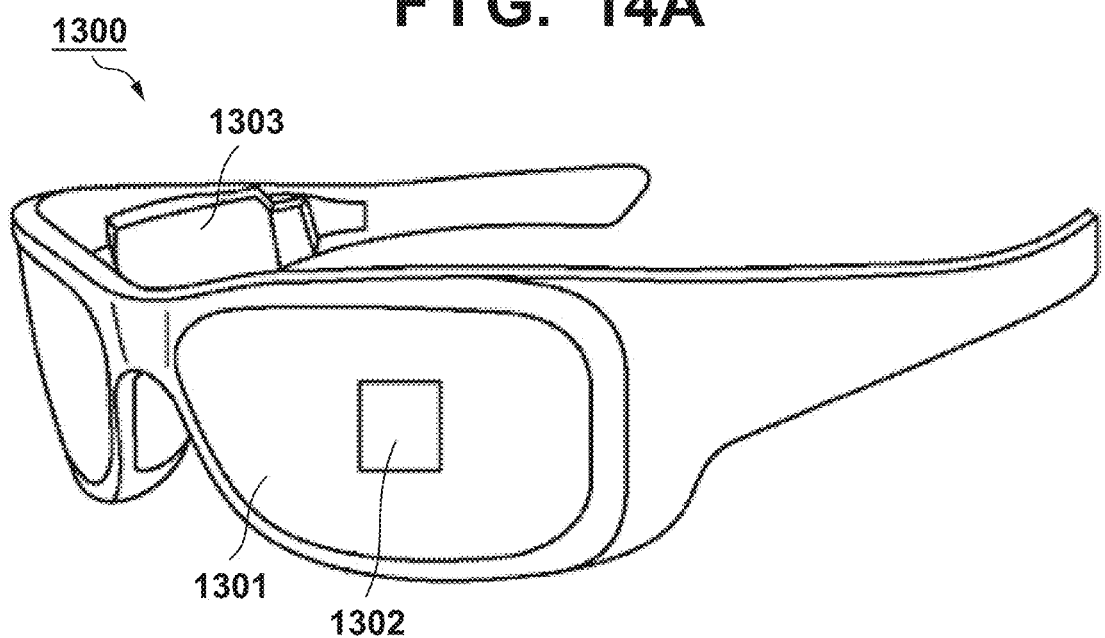
FIG. 14A is a view showing an application example of the display device according to the embodiment.

FIG. 14A illustrates a pair of glasses 1600 (smart glasses) according to an application example. An image capturing apparatus 1602 such as a CMOS sensor or an SPAD is arranged on the front surface side of a lens 1601 of the glasses 1600. Also, the display device with the light emitting device 100 applied thereto is arranged on the back surface side of the lens 1601.

The pair of glasses 1600 further includes a control apparatus 1603. The control apparatus 1603 functions as a power supply that supplies power to the image capturing apparatus 1602 and the display device according to the embodiments. The control apparatus 1603 controls the operation of the image capturing apparatus 1602 and the operation of the display device. An optical system for focusing light to the image capturing apparatus 1602 is formed on the lens 1601.

Figure 14B:
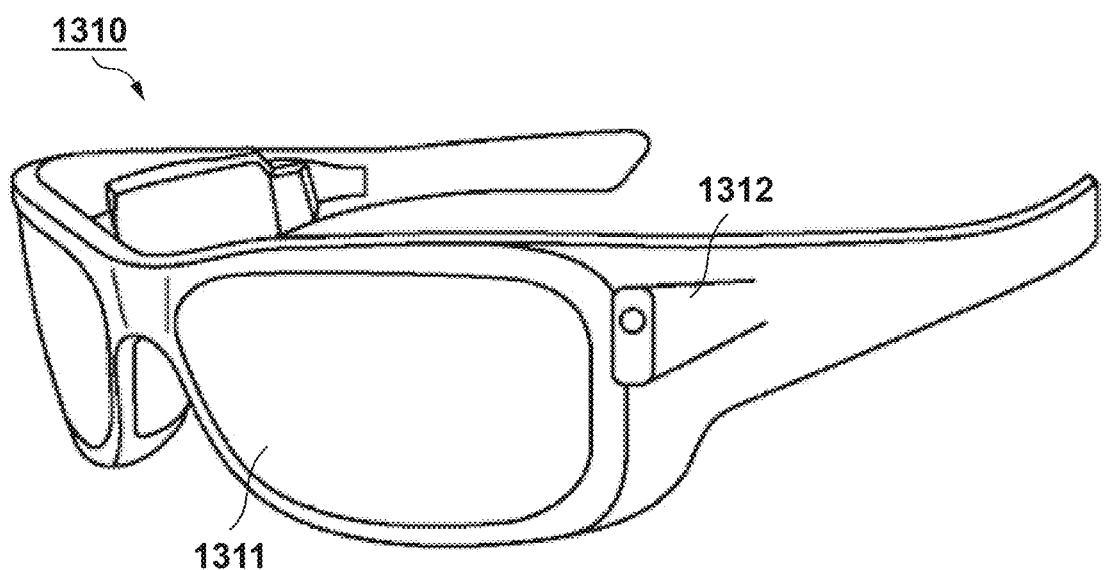
FIG. 14B is a view showing an application example of the display device according to the embodiment.

FIG. 14B illustrates a pair of glasses 1610 (smart glasses) according to another application example. The pair of glasses 1610 includes a control apparatus 1612, and an image capturing apparatus corresponding to the image capturing apparatus 1602 and a display device are incorporated in the control apparatus 1612. An optical system for projecting light emitted from the image capturing apparatus and the display device in the control apparatus 1612 is formed in the control apparatus 1612, and an image is projected onto the lens 1611. In addition to functioning as a power supply that supplies power to the image capturing apparatus and the display device, the control apparatus 1612 also controls the operation of the image capturing apparatus and the operation of the display device. The control apparatus may also include a line-of-sight detection unit that detects the line of sight of a wearer. Infrared light may be used for the line-of-sight detection. An infrared light emitting unit emits infrared light to the eyeball of a user who is gazing upon a displayed image. When the emitted infrared light is reflected by the eyeball and detected by an image capturing unit including a light receiving element, a captured image of the eyeball can be obtained. Image quality degradation is reduced by providing a reduction means that reduces the light from the infrared light emitting unit to the display unit in a planar view.

The line of sight of the user to the displayed image is detected from the captured image of the eyeball obtained by the image capturing operation using the infrared light. A known method can be arbitrarily applied for the line-of-sight detection using the captured eyeball image. As an example, a line-of-sight detection method based on Purkinje images caused by the reflection of the emitted light on the cornea can be used.

More specifically, line-of-sight detection processing is performed based on a pupil-cornea reflection method. The line of sight of the user is detected by using the pupil-cornea reflection method to calculate a line-of-sight vector representing the direction (rotation angle) of the eyeball based on the image of the pupil and the Purkinje images included in the captured image of the eyeball.

A display apparatus according to one embodiment of the present invention may include an image capturing apparatus including a light receiving element, and control a displayed image on the display apparatus based on the line-of-sight information of the user obtained from the image capturing apparatus.

More specifically, in the display apparatus, a first field-of-view region which is gazed upon by the user and a second field-of-view region other than the first field-of-view region are determined based on the line-of-sight information. The first field-of-view region and the second field-of-view region may be determined by a control apparatus of the display apparatus. Alternatively, the first field-of-view region and the second field-of-view region may be determined by an external control apparatus and the display apparatus may receive information corresponding to this determination. Control can be performed in the display region of the display apparatus so that the display resolution of the first field-of-view region will be higher than the display resolution of the second field-of-view region. That is, the resolution of the second field-of-view region may be lowered more than the resolution of the first field-of-view region.

In addition, the display region includes a first display region and a second display region different from the first display region, and a region with a high degree of priority is determined from the first display region and the second display region of the display region based on the line-of-sight information. The first field-of-view region and the second field-of-view region may be determined by the control apparatus of the display apparatus. Alternatively, the first field-of-view region and the second field-of-view region may be determined by an external control apparatus and the display apparatus may receive information corresponding to this determination. Control may be performed so that the resolution of a region with the high degree of priority will be set higher than the resolution of a region other than the region with the high degree of priority. That is, the resolution of a region with a relatively low degree of priority can be set low.

Note that an AI may be used for the determination of the first field-of-view region and the region with the high degree of priority. The AI may be a model configured to estimate, from an image of the eyeball, the angle of the line of sight and the distance to an object as the target of the gaze by using the image of the eyeball and the direction actually gazed upon by the eyeball of the image as the teaching data. The display apparatus, the image capturing apparatus, or an external apparatus may include the AI program. If the AI program is included in an external apparatus, information determined by the AI program will be transmitted to the display apparatus by communication.

In a case in which display control is to be performed based on visual recognition detection, the display device according to the embodiments can be preferably applied to a pair of smart glasses that further includes an image capturing apparatus configured to capture the outside. The smart glasses can display the captured external information in real time.

As has been described above, by using the device using the organic light emitting element according to this embodiment, it is possible to perform stable display even for a long-time display with good image quality.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A display device configured to display an image in which each frame is formed by at least two subframes, comprising:
   a drive unit configured to drive a plurality of pixels in a pixel array so as to drive pixels in at least two rows based on pixel data of each row of each supplied subframe data, wherein
   the drive unit drives the plurality of pixels so as to cause pixels in a row not matching a row in the supplied current subframe data to emit light with a first condition, and cause pixels in a row matching the row in the current subframe data to emit light with a second condition,
   the second condition is a condition in which a light emission amount is larger than in the first condition when causing the pixels to emit light in accordance with identical pixel values.

2. The display device according to claim 1, wherein
   in the first condition, a light emission period for causing pixels to emit light is a first light emission period, and in the second condition, a light emission period for causing pixels to emit light is a second light emission period longer than the first light emission period.

3. The display device according to claim 2, wherein
   each of the plurality of pixels includes a transistor configured to control a light emission period, and
   the drive unit controls the transistor of each of the plurality of pixels so as to cause pixels in a row not matching a row in supplied current subframe data to emit light in accordance with the first light emission period, and cause pixels in a row matching the row in the current subframe to emit light in accordance with the second light emission period.

4. The display device according to claim 3, wherein
   the drive unit includes a plurality of selection units arranged such that one selection unit is assigned to one row, and each selection unit selects, from a plurality of control signals including a first control signal that defines a first light emission period and a second control signal that defines a second light emission period longer than the first light emission period, a control signal corresponding to supplied current subframe data, and outputs the selected control signal, and
   the transistors of pixels in each row are controlled by an output of a corresponding selection unit among the plurality of selection units.

5. The display device according to claim 1, wherein
   the second condition is a condition in which light emission intensity is higher than in the first condition.

6. The display device according to claim 5, wherein
   each of the plurality of pixels includes a memory, and is configured to emit light in accordance with a signal written in the memory, and
   the drive unit controls, so as to satisfy the first condition and the second condition, a pixel signal to be written in the memory of each of the plurality of pixels based on supplied current subframe data.

7. The display device according to claim 6, wherein
   the drive unit includes a first data line configured to supply pixel signals to pixels in a row matching a row in first subframe data of supplied subframe data, and a second data line configured to supply pixel signals to pixels in a row matching a row in second subframe data of the supplied subframe data, and
   the drive unit controls, so as to satisfy the first condition and the second condition, pixel signals to be supplied to the first data line and the second data line based on supplied current subframe data.

8. The display device according to claim 1, wherein
   the at least two subframes include an even-numbered subframe and an odd-numbered subframe.

9. The display device according to claim 1, further comprising
   a determination unit configured to determine that supplied current subframe data is one the at least two subframes.

10. An electronic apparatus comprising:
    an image capturing unit configured to capture an object; and
    a display device defined in claim 1, configured to display an image based on data from the image capturing unit.

11. A moving body comprising:
    an image capturing unit configured to capture an object; and
    a display device defined in claim 1, configured to display an image based on data from the image capturing unit.

12. A display device that uses image data in which one frame is formed by at least two subframes, and drives a plurality of rows including a first row using data based on the same data, wherein
    the one frame includes a first subframe for which the first row and another row among the plurality of rows are driven using data based on drive data of the first row, and a second subframe for which the first row and another row among the plurality of rows are driven using data based on drive data of the other row, and
    a light emission amount of at least one pixel included in the first row in the first subframe is larger than a light emission amount thereof in the second subframe.

13. The display device according to claim 12, wherein
    the at least two subframes include an even-numbered subframe and an odd-numbered subframe.

14. The display device according to claim 12, further comprising
    a determination unit configured to determine the first subframe or the second subframe based on the drive data.

* * * * *